(12) United States Patent
Kim

(10) Patent No.: US 9,659,951 B1
(45) Date of Patent: May 23, 2017

(54) SINGLE POLY NONVOLATILE MEMORY CELLS, ARRAYS THEREOF, AND METHODS OF OPERATING THE SAME

(71) Applicant: SK hynix Inc., Gyeonggi-do (KR)

(72) Inventor: Jeong Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/207,980

(22) Filed: Jul. 12, 2016

(30) Foreign Application Priority Data

Feb. 12, 2016 (KR) .................. 10-2016-0016567

(51) Int. Cl.
| | |
|---|---|
| *H01L 29/788* | (2006.01) |
| *H01L 27/11558* | (2017.01) |
| *H01L 29/08* | (2006.01) |
| *H01L 29/06* | (2006.01) |
| *H01L 27/11524* | (2017.01) |
| *H01L 23/528* | (2006.01) |

(52) U.S. Cl.
CPC ...... *H01L 27/11558* (2013.01); *H01L 23/528* (2013.01); *H01L 27/11524* (2013.01); *H01L 29/0684* (2013.01); *H01L 29/0847* (2013.01); *H01L 29/7883* (2013.01)

(58) Field of Classification Search
CPC .................... H01L 27/11558; H01L 27/11524
USPC ........................................ 257/318
See application file for complete search history.

(56) References Cited

U.S. PATENT DOCUMENTS 7,449,754 B2    11/2008   Moore

*Primary Examiner* — Anthony Ho
(74) *Attorney, Agent, or Firm* — IP & T Group LLP

(57) ABSTRACT

A single poly nonvolatile memory (NVM) cell includes first and second active regions disposed to face each other and third and fourth active regions spaced apart from the first and second active regions. A drain region, a junction region and a source region are disposed in the fourth active region. A floating gate is disposed on the first and second active regions and is disposed to extend onto the third and fourth active regions. A read/selection gate is disposed to cross the fourth active region between the drain region and the junction region. The first active region is coupled to a first array control gate line, and the second active region is coupled to a second array control gate line. The source region, the junction region and the floating gate constitute a floating gate transistor. The drain region, the junction region and the read/selection gate constitute a read/selection transistor.

20 Claims, 15 Drawing Sheets

SINGLE POLY NONVOLATILE MEMORY CELLS, ARRAYS THEREOF, AND METHODS OF OPERATING THE SAME

CROSS-REFERENCE TO RELATED APPLICATIONS

The present application claims priority under 35 U.S.C 119(a) to Korean Patent Application No. 10-2016-0016567, filed on Feb. 12, 2016, which is herein incorporated by references in its entirety.

BACKGROUND

1. Technical Field

Various embodiments of the present disclosure generally relate to nonvolatile memory devices and methods for operating the same and, more particularly, relate to single poly nonvolatile memory (NVM) cells, arrays thereof, and methods for operating the same.

2. Related Art

Recently, a lot of effort has been focused on applying NVM devices to memory devices embedded in system-on-chip (SOC) packages which are also referred to as SOC embedded memory devices. Typical NVM devices are fabricated using a double poly process that provides two different polysilicon layers which are vertically stacked. Thus, there may be some limitations in applying the typical NVM devices to the SOC embedded memory devices which is fabricated by a standard complementary metal-oxide-semiconductor (CMOS) process.

Fabrication of the typical NVM devices may require complicated processes including deposition steps for stacking polysilicon layers and etch steps for patterning the polysilicon layers to form a stack structure of a floating gate and a control gate. Since the typical NVM devices are fabricated to have the stack structure of the floating gate and the control gate, a probability of a misalignment between the floating gate and the control gate may increase, reducing the fabrication yield of the typical NVM devices. Accordingly, single poly NVM devices are very attractive as candidates for the SOC embedded memory devices since the single poly NVM devices can be fabricated using a standard CMOS process.

SUMMARY

According to an embodiment, a single poly NVM cell includes first and second active regions disposed to face each other and third and fourth active regions spaced apart from the first and second active regions. A drain region, a junction region and a source region are disposed in the fourth active region. A floating gate is disposed on the first and second active regions and is disposed to extend onto the third and fourth active regions. A read/selection gate is disposed to cross the fourth active region between the drain region and the junction region. The first active region is coupled to a first array control gate line, and the second active region is coupled to a second array control gate line.

According to another embodiment, a single poly NVM cell includes a floating gate transistor and a read/selection transistor. The floating gate transistor has a floating gate, a source terminal and a junction terminal. The read/selection transistor has a gate terminal, a drain terminal and the junction terminal. A word line is coupled to the gate terminal, and a bit line is coupled to the drain terminal. A first array control gate line is coupled to the floating gate through a first capacitive element, and a second array control gate line is coupled to the floating gate through a second capacitive element. A tunneling line is coupled to the floating gate through a third capacitive element.

According to another embodiment, a single poly NVM cell array includes unit cells respectively located at cross points of rows and columns, first array control gate lines, word lines, tunneling lines, second array control gate lines, and bit lines. Each of the first array control gate lines is coupled to the unit cells arrayed in any one of the rows, and each of the word lines is coupled to the unit cells arrayed in any one of the rows. Each of the tunneling lines is coupled to the unit cells arrayed in any one of the rows, and each of the second array control gate lines is coupled to the unit cells arrayed in any one of the columns. Each of the bit lines is coupled to the unit cells arrayed in any one of the columns. Each of the unit cells includes a first active region coupled to any one of the first array control gate lines, a second active region coupled to any one of the second array control gate lines and disposed to face the first active region, a third active region disposed to be spaced apart from the first and second active regions and coupled to any one of the tunneling lines, a fourth active region disposed to be spaced apart from the first and second active regions. A drain region, a junction region and a source region are disposed in the fourth active region. A floating gate is disposed on the first and second active regions and is disposed to extend onto the third and fourth active regions. A read/selection gate is disposed to cross the fourth active region between the drain region and the junction region.

According to another embodiment, there is provided a method of operating a single poly NVM cell including a first active region and a second active region disposed to face each other in a first direction; a third active region and a fourth active region spaced apart from the first and second active regions; a drain region, a junction region and a source region disposed in the fourth active region; a floating gate disposed on the first and second active regions and disposed to extend onto the third and fourth active regions; a read/selection gate disposed to cross the fourth active region between the drain region and the junction region; a first array control gate line coupled to the first active region; and a second array control gate line coupled to the second active region. The method includes electrically floating the read/selection gate and the drain region, applying a positive program voltage to the first and second array control gate lines, and applying a ground voltage to the third active region to program the single poly NVM cell.

According to another embodiment, there is provided a method of operating a single poly NVM cell array including unit cells respectively located at cross points of rows and columns; first array control gate lines, each of which is coupled to the unit cells arrayed in any one of the rows; word lines, each of which is coupled to the unit cells arrayed in any one of the rows; tunneling lines, each of which is coupled to the unit cells arrayed in any one of the rows; second array control gate lines, each of which is coupled to the unit cells arrayed in any one of the columns; and bit lines, each of which is coupled to the unit cells arrayed in any one of the columns, wherein each of the unit cells includes a first active region coupled to any one of the first array control gate lines; a second active region coupled to any one of the second array control gate lines and disposed to face the first active region; a third active region disposed to be spaced apart from the first and second active regions and coupled to any one of the tunneling lines; a fourth active region disposed to be spaced apart from the first and second active regions; a drain region, a junction region and a source region disposed in the fourth active region; a floating gate disposed on the first and second active regions and disposed to extend onto the third and fourth active regions; and a read/selection gate disposed to cross the fourth active region between the drain region and the junction region. The method includes electrically floating the word lines and the bit lines and applying a positive program voltage to one selected from the first array control gate lines and one selected from the second array control gate lines to select one of the unit cells, applying a ground voltage to the remaining first array control gate lines and the remaining second array control gate lines, and applying the ground voltage to all of the tunneling lines to program the selected unit cell coupled to the selected first and second array control gate lines.

DETAILED DESCRIPTION OF THE EMBODIMENTS

Figure 1:
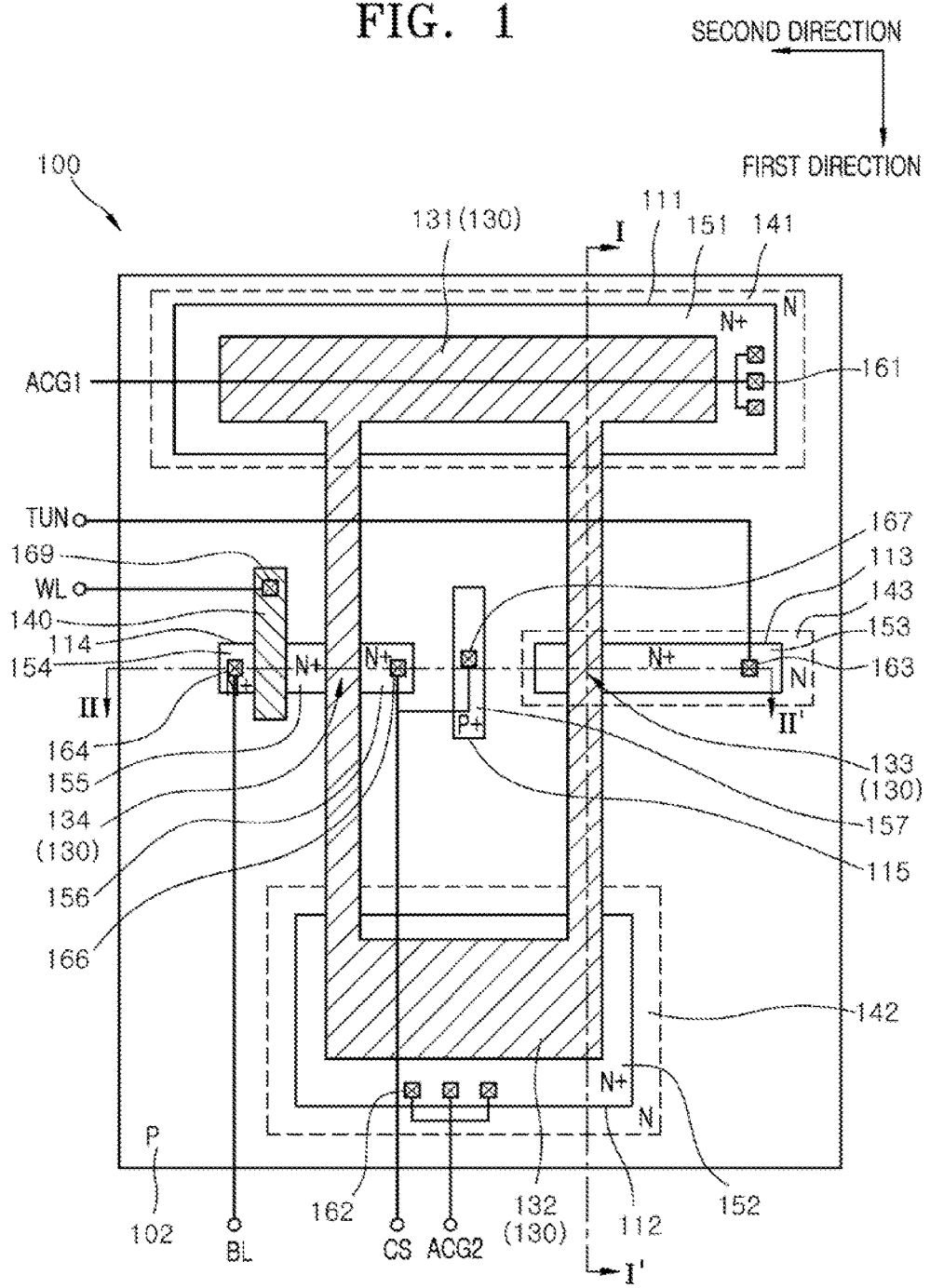
FIG. 1 is a layout diagram illustrating a single poly NVM cell according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms including technical and scientific terms, used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing only a positional relationship of two elements and are not intended to limit the scope of the present disclosure. Other words used to describe the relationship between elements or layers should be interpreted in a like fashion for example, "between" versus "directly between," "adjacent" versus "directly adjacent," "on" versus "directly on".

The same reference numerals refer to the same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
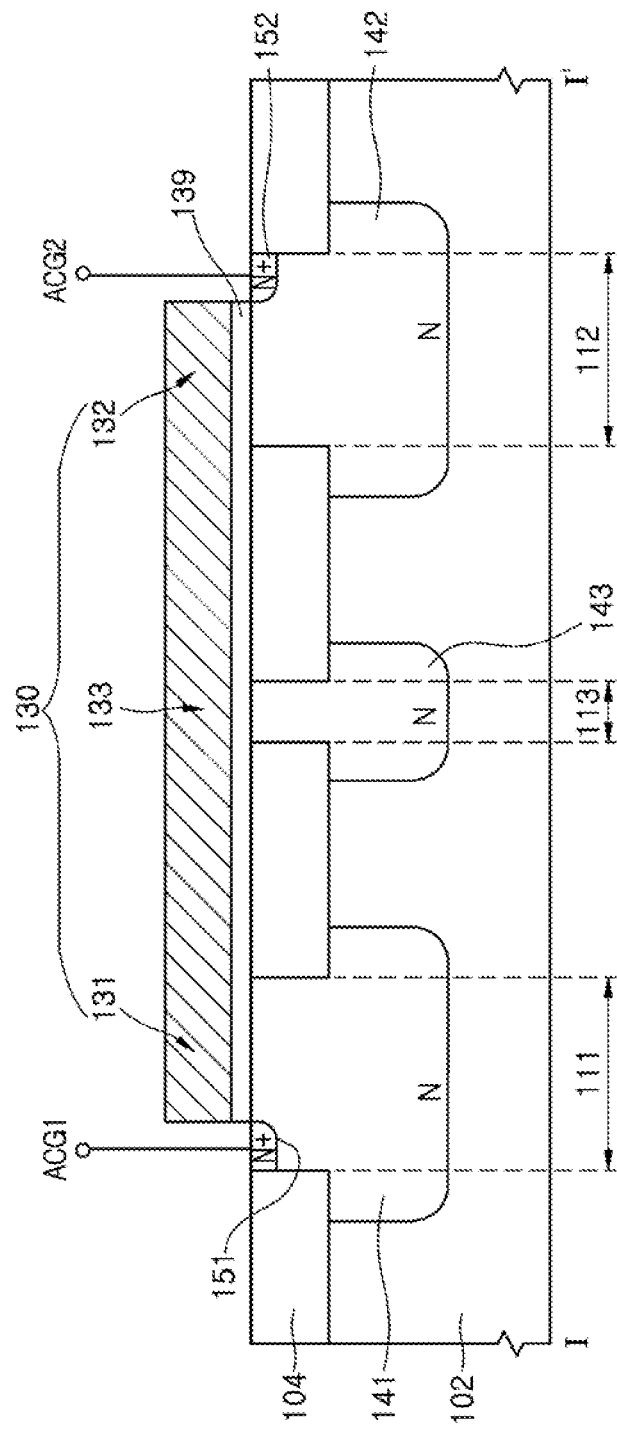
FIG. 2 is a cross-sectional view taken along the line I-I' of FIG. 1.
Figure 3:
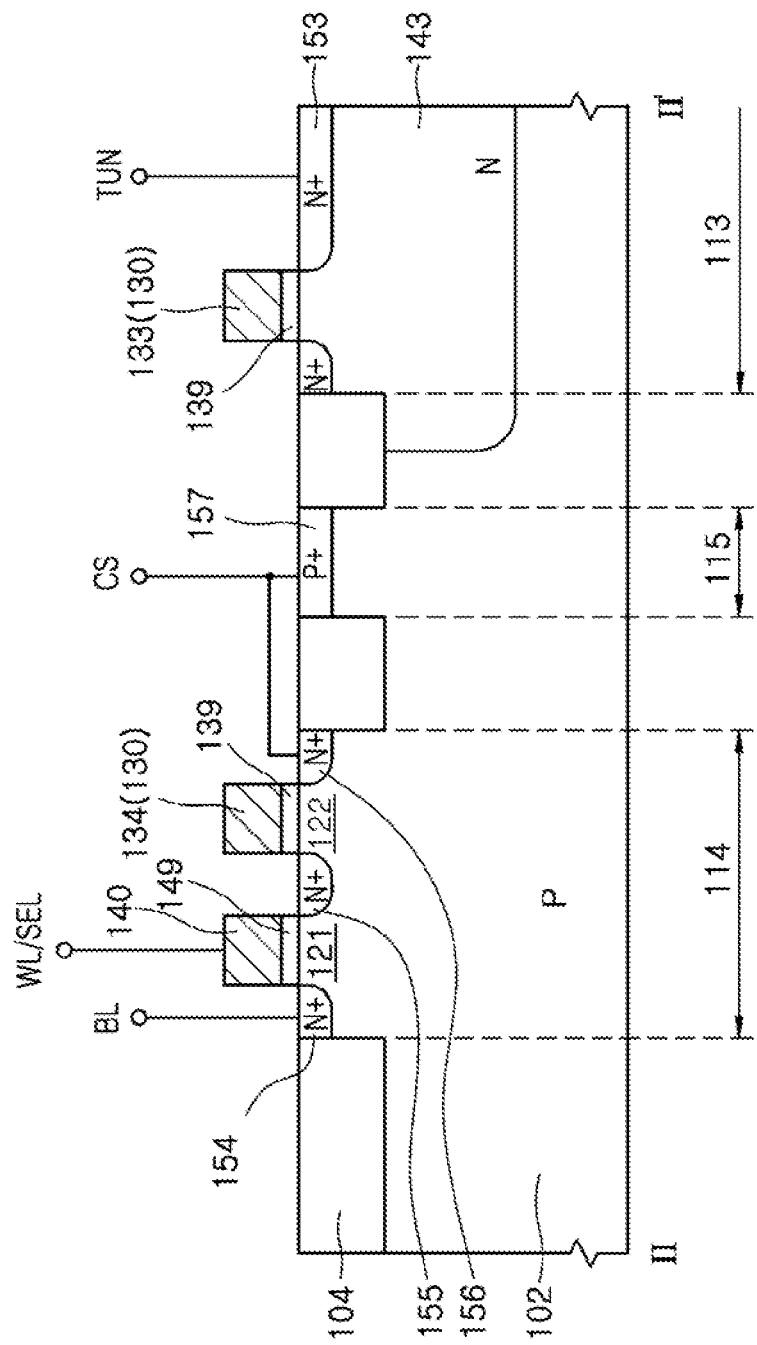
FIG. 3 is a cross-sectional view taken along the line II-II' of FIG. 1.

FIG. 1 is a layout diagram illustrating a single poly NVM cell 100 according to an embodiment. FIG. 2 is a cross-sectional view taken along the line I-I' of FIG. 1, and FIG. 3 is a cross-sectional view taken along the line II-II' of FIG. 1. Referring to FIGS. 1, 2, and 3, the single poly NVM cell 100 may include a plurality of N-type well regions disposed in a P-type semiconductor region 102. For example, the single poly NVM cell 100 may include a first N-type well region 141, a second N-type well region 142, and a third N-type well region 143 disposed in the P-type semiconductor region 102. The term "P-type" means a conductivity type of a region which is doped with impurities having a first conductivity type, and the term "N-type" means a conductivity type of a region which is doped with impurities having a second conductivity type that is opposite to the first second conductivity type.

The P-type semiconductor region 102 may be a P-type semiconductor substrate. The P-type semiconductor substrate may correspond to a P-type silicon substrate. In some embodiments, the P-type semiconductor region 102 may be a P-type junction region formed in a semiconductor substrate, for example, a P-type well region. Alternatively, the P-type semiconductor region 102 may be a P-type epitaxial layer grown on a semiconductor substrate.

The first, second and third N-type well regions 141, 142 and 143 may be spaced apart from each other by the P-type semiconductor region 102. For example, the first, second and third N-type well regions 141, 142 and 143 may be separated from each other by portions of the P-type semiconductor layer 102 in a first direction. In some embodiments, each of the first, second and third N-type well regions 141, 142 and 143 may have a rectangular shape in a plan view.

The first N-type well region 141 may face the second N-type well region 142. The first N-type well region 141 may have a rectangular shape extending in a second direction perpendicular to the first direction in a plan view. The second N-type well region 142 may also have a rectangular shape extending in the second direction in a plan view. A length of the second N-type well region 142 in the second direction may be shorter than a length of the first N-type well region 141 in the second direction. A width of the second N-type well region 142 in the first direction may be greater than a width of the first N-type well region 141 in the first direction.

That is, the second N-type well region 142 may be a tetragon-shaped region having a width and a length which are different from a width and a length of the first N-type well region 141, in a plan view. A planar area of the first N-type well region 141 may be substantially or effectively equal to that of the second N-type well region 142. Alternatively, the planar area of the first N-type well region 141 may be less than or greater than that of the second N-type well region 142.

The third N-type well region 143 may be disposed between the first and second N-type well regions 141 and 142 in the first direction. The third N-type well region 143 may have a stripe shape extending in the second direction. A planar area of the third N-type well region 143 may be less than a planar area of the first N-type well region 141, a planar area of the second N-type well region 142, or both.

The first, second and third N-type well regions 141, 142 and 143 may be simultaneously formed using the same ion implantation process. Accordingly, the first, second and third N-type well regions 141, 142 and 143 may be formed to have substantially the same impurity concentration and substantially the same junction depth.

A first active region 111 may be defined in the first N-type well region 141, as illustrated in FIGS. 1 and 2. In some embodiments, the first active region 111 may be defined to have a rectangular shape extending in the second direction. A second active region 112 may be defined in the second N-type well region 142. In some embodiments, the second active region 112 may be defined to have a rectangular shape. A third active region 113 may be defined in the third N-type well region 143. In some embodiments, the third active region 113 may be defined to have a stripe shape extending in the second direction in a plan view.

The first and second active regions 111 and 112 may be spaced apart from each other in the first direction and may face each other. A fourth active region 114 may be defined in the P-type semiconductor region 102 between the first and second active regions 111 and 112, as illustrated in FIGS. 1 and 3. The P-type semiconductor region 102 under the fourth active region 114 may correspond to a P-type well region. The fourth active region 114 may be defined to have a stripe shape extending in the second direction in a plan view. As illustrated in FIG. 1, the fourth active region 114 may be arranged side by side with the third N-type well region 143 in the second direction.

A fifth active region 115 may be defined in the P-type semiconductor region 102 between the third and fourth active regions 113 and 114. The P-type semiconductor region 102 under the fifth active region 115 may correspond to a P-type well region. The fifth active region 115 may be defined to have a stripe shape extending in the first direction in a plan view.

The first, second, third, fourth and fifth active regions 111, 112, 113, 114 and 115 may be defined by a shallow trench isolation (STI) layer 104. In some embodiments, the third and fourth active regions 113 and 114 may be arrayed in a diagonal direction between the first and second directions. Although FIGS. 1, 2 and 3 illustrate an example in which both of the third and fourth active regions 113 and 114 are disposed between the first and second active regions 111 and 112, the present disclosure is not limited thereto.

For example, the third and fourth active regions 113 and 114 may be located on opposite side of the first active region 111 not between the first and second active regions 111 and 112. In another embodiment, the third and fourth active regions 113 and 114 may be located on opposite side of the second active region 112 not between the first and second active regions 111 and 112. In another embodiment, the fourth active region 114 may be located between the first and second active regions 111 and 112, and the third active region 113 may be located at one side of the second active region 112 not between the first and second active regions 111 and 112. That is, the third active region 113 may be located between the first and second active regions 111 and 112 or be located at another region, other than between the first and second active regions 111 and 112. In another embodiment, the forth active region 114 may be located between the first and second active regions 111 and 112 or be located at another region, other than between the first and second active regions 111 and 112.

A first N-type contact region 151 may be disposed in the first active region 111. The first N-type contact region 151 may have a rectangular loop shape, at least a portion of which is opened in a plan view. The first N-type contact region 151 may be coupled to a first array control gate line ACG1 through first contacts 161. A second N-type contact region 152 may be disposed in the second active region 112. The second N-type contact region 152 may have a rectangular loop shape, at least a portion of which is opened in a plan view. The second N-type contact region 152 may be coupled to a second array control gate line ACG2 through second contacts 162.

A third N-type contact region 153 may be disposed in the third active region 113, as illustrated in FIGS. 1 and 3. The third N-type contact region 153 may be coupled to a tunneling line TUN through a third contact 163. An N-type drain region 154, an N-type junction region 155 and an N-type source region 156 may be disposed in the fourth active region 114. The N-type drain region 154, the N-type junction region 155 and the N-type source region 156 may be spaced apart from each other in the second direction. The N-type drain region 154 and the N-type Junction region 155 may be separated from each other in the second direction by a first channel region 121. The N-type junction region 155 and the N-type source region 156 may be separated from each other in the second direction by a second channel region 122.

Although not shown in the drawings, each of the N-type drain region 154, the N-type junction region 155 and the N-type source region 156 may have a lightly doped drain (LDD) structure. The N-type drain region 154 may be coupled to a bit line BL through a drain contact 164. The N-type junction region 155 may be floated. The N-type source region 156 may be coupled to a common source line CS through a source contact 166.

A P-type contact region 157 may be disposed in the fifth active region 115. The P-type contact region 157 may be coupled to the common source line CS through a fourth contact 167. Accordingly, the common source line CS may be electrically connected to the P-type contact region 157 as well as the N-type source region 156.

A first gate insulation layer 149 and a read/selection gate 140 may be sequentially stacked on the first channel region 121 of the fourth active region 114. In some embodiments, the first gate insulation layer 149 may include a silicon oxide layer, and the read/selection gate 140 may include a polysilicon layer. The first gate insulation layer 149 and the read/selection gate 140 may intersect the to fourth active region 114 to have a stripe shape extending in the first direction in a plan view. The read/selection gate 140 may be coupled to a word line WL through a gate contact 169.

A second gate insulation layer 139 and a floating gate 130 may be sequentially stacked on the second channel region 122 of the fourth active region 114. The second channel region 122 may overlap with a fourth portion 134 of the floating gate 130. In some embodiments, the second gate insulation layer 139 may include a silicon oxide layer, and the floating gate 130 may include a polysilicon layer. The second gate insulation layer 139 and the floating gate 130 may intersect the fourth active region 114 to have a stripe shape extending in the first direction in a plan view. The second gate insulation layer 139 and the floating gate 130 may extend onto the P-type semiconductor region between the first and second N-type well regions 141 and 142 and may further extend onto the first active region 111 in the first N-type well region 141 and the second active region 112 in the second N-type well region 142.

A first portion 131 of the floating gate 130 may overlap the first N-type well region 141. In the first active region 111, the first portion 131 of the floating gate 130, the second gate insulation layer 139 and the first N-type well region 141 may constitute a first MOS capacitor. A second portion 132 of the floating gate 130 may overlap the second N-type well region 142. In the second active region 112, the second portion 132 of the floating gate 130, the second gate insulation layer 139 and the second N-type well region 142 may constitute a second MOS capacitor.

The first portion 131 of the floating gate 130 may extend in the first direction to provide a third portion 133 of the floating gate 130 overlapping with the third active region 113 and may further extend to reach the second portion 132 of the floating gate 130. The second gate insulation layer 139 may also extend between the third portion 133 of the floating gate 130 and the third N-type well region 143. Accordingly, in the third active region 113, the second gate insulation layer 139 and the third portion 133 of the floating gate 130 may overlap the third N-type well region 143. Thus, the third portion 133 of the floating gate 130, the second gate insulation layer 139 and the third N-type well region 143 in the third active region 113 may constitute a third MOS capacitor.

Figure 4:
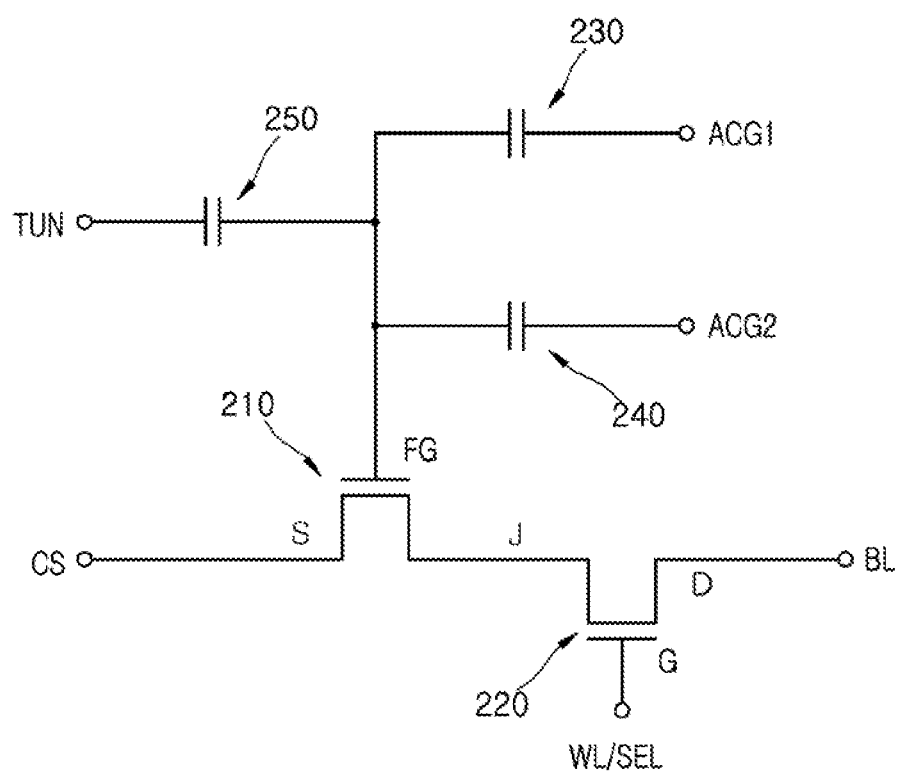
FIG. 4 is a circuit diagram of a single poly NVM cell according to an embodiment.

FIG. 4 is a circuit diagram 200 of the single poly NVM cell 100 according to an embodiment. Referring to FIG. 4, the circuit diagram 200 of the single poly NVM cell 100 may include an N-channel floating gate transistor 210 and an N-channel read/selection transistor 220. The N-channel floating gate transistor 210 may have a floating gate FG, a source terminal S and a junction terminal J. The N-channel read/selection transistor 220 may share the junction terminal 3 with the N-channel floating gate transistor 210. The floating gate FG of the N-channel floating gate transistor 210 may be coupled to the first array control gate line ACG1 through a first capacitive element 230 and may also be coupled to the second array control gate line ACG2 through a second capacitive element 240. In addition, the floating gate FG of the N-channel floating gate transistor 210 may be coupled to the tunneling line TUN through a third capacitive element 250.

The first array control gate line ACG1 coupled to the first capacitive element 230, the second array control gate line ACG2 coupled to the second capacitive element 240, and the tunneling line TUN coupled to the third capacitive element 250 may be connected in parallel to the floating gate FG of the N-channel floating gate transistor 210.

The source terminal S of the N-channel floating gate transistor 210 may be coupled to the common source line CS. The N-channel read/selection transistor 220 may have a gate terminal G, a drain terminal D and the junction terminal 3. The gate terminal G of the N-channel read/selection transistor 220 may be coupled to the word line WL. The word line WL may correspond to a word/selection line WL/SEL. The drain terminal D of the N-channel read/selection transistor 220 may be coupled to the bit line BL. The junction terminal 3 shared by the N-channel floating gate transistor 210 and the N-channel read/selection transistor 220 may be floated.

The N-channel floating gate transistor 210 may be comprised of the N-type junction region 155, the second channel region 122, the N-type source region 156, the second gate insulation layer 139 and the fourth portion 134 of the floating gate 130 of the single poly NVM cell 100 which is described with reference to FIGS. 1, 2 and 3. The N-channel read/selection transistor 220 may be comprised of the N-type drain region 154, the first channel region 121, the N-type junction region 155, the first gate insulation layer 149 and the read/selection gate 140 of the single poly NVM cell 100 which is described with reference to FIGS. 1, 2 and 3.

The first capacitive element 230 may correspond to the first MOS capacitor which is comprised of the first portion 131 of the floating gate 130, the second gate insulation layer 139 and the first N-type well region 141 that are disposed in the first active region 111 of the single poly NVM cell 100. See FIGS. 1, 2 and 3. The second capacitive element 240 may correspond to the second MOS capacitor which is comprised of the second portion 132 of the floating gate 130, the second gate insulation layer 139 and the second N-type well region 142 that are disposed in the first active region 111 of the single poly NVM cell 100 illustrated in FIGS. 1, 2 and 3. The third capacitive element 250 may correspond to the third MOS capacitor which is comprised of the third portion 133 of the floating gate 130, the second gate insulation layer 139 and the third N-type well region 143 that are disposed in the third active region 113 of the single poly NVM cell 100 illustrated in FIGS. 1, 2 and 3.

In the single poly NVM cell 100 according to an embodiment, program and erasure operations can be performed without an activation of the N-channel read/selection transistor 220. The N-channel read/selection transistor 220 may serve as a selection transistor only in a read operation. The program operation and the erasure operation of the single poly NVM cell 100 may be executed by a Fowler-Nordheim (F-N) tunneling mechanism. Each of the program operation and the erasure operation of the single poly NVM cell 100 may be executed using only two different voltages such as a positive program voltage +Vpp and a ground voltage. That is, no negative bias voltage may be required for the program operation and the erasure operation. Thus, a negative charge pump circuit for generating the negative bias voltage may not be required to operate the single poly NVM cell 100.

Figure 5:
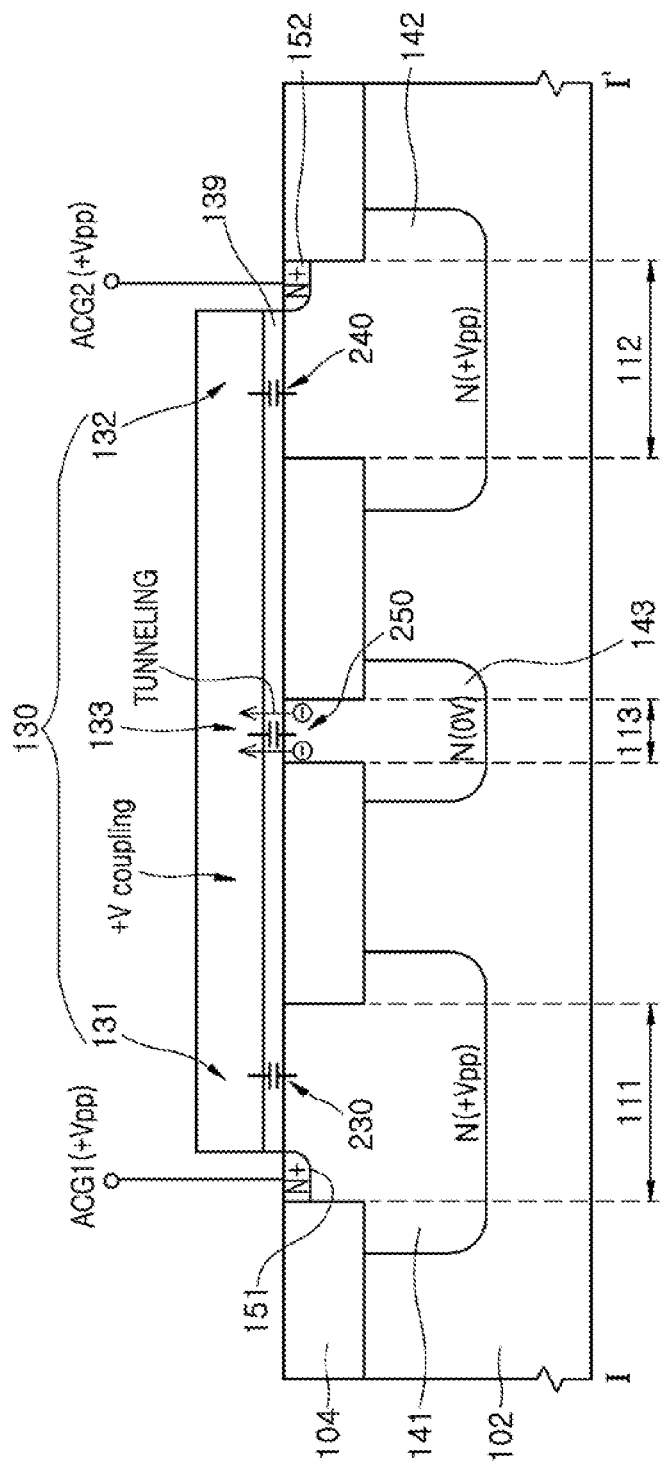
FIGS. 5 and 6 are cross-sectional views each of which illustrates a program operation of a single poly NVM cell according to an embodiment.
Figure 6:
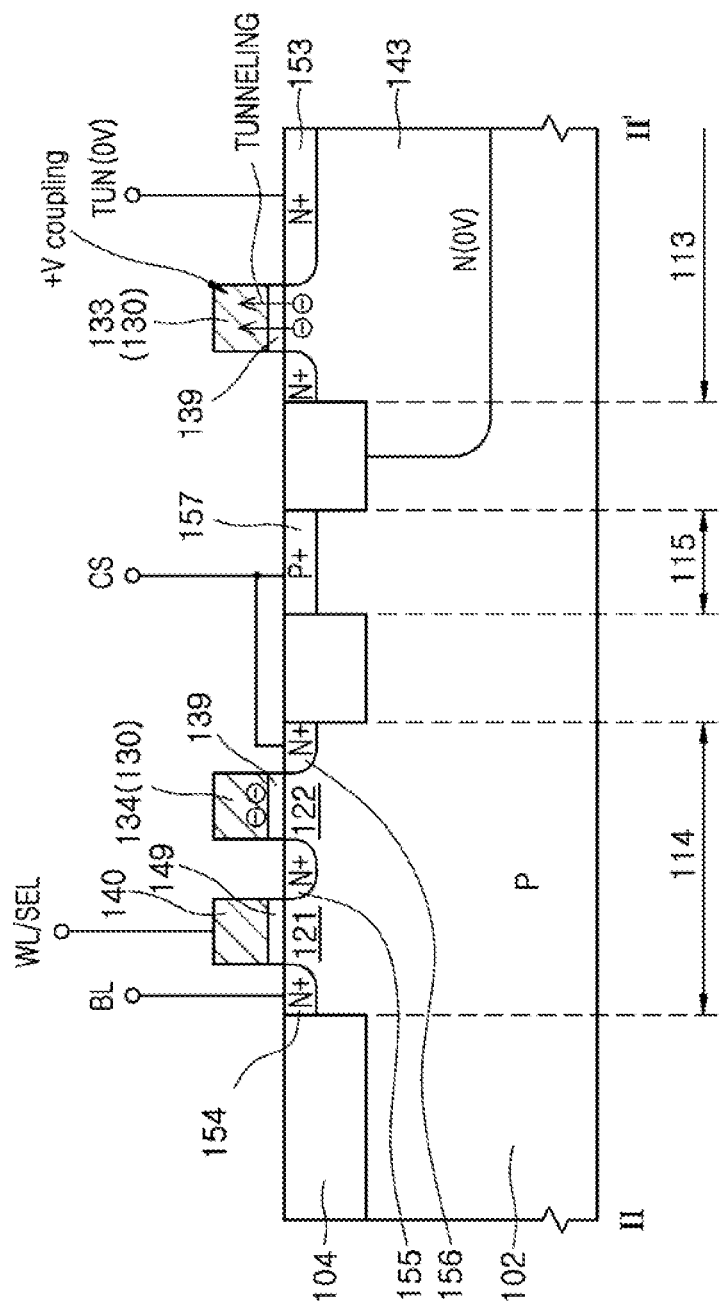

FIGS. 5 and 6 are cross-sectional views illustrating a program operation of the single poly NVM cell 100 according to an embodiment. The cross-sectional view of FIG. 5 is a cross-sectional view taken along the line I-I' of FIG. 1, and the cross-sectional view of FIG. 6 is a cross-sectional view taken along the line II-II' of FIG. 1. In FIGS. 5 and 6, the same reference numerals or designators as used in FIGS. 1 to 4 denote the same elements.

Referring to FIGS. 5 and 6, to execute the program operation of the single poly NVM cell 100, a positive program voltage +Vpp may be applied to the first and second array control gate lines ACG1 and ACG2 and a ground voltage may be applied to the tunneling line TUN. In some embodiments, two different program voltages may be applied to the first and second array control gate lines ACG1 and ACG2, respectively. However, in the present embodiment, the same positive program voltage +Vpp may be applied to both of the first and second array control gate lines ACG1 and ACG2.

During the program operation, the word/selection line WL/SEL and the bit line BL may be floated. Since the word/selection line WL/SEL is floated, the program operation of the single poly NVM cell 100 may not be affected by the N-channel read/selection transistor 220 that is comprised of the N-type drain region 154, the first channel region 121, the N-type junction region 155, the first gate insulation layer 149 and the read/selection gate 140.

In the program operation according to the present embodiment, only two different voltages such as the positive program voltage +Vpp and the ground voltage may be used to program the single poly NVM cell 100. That is, the program operation of the single poly NVM cell 100 may be achieved using the positive program voltage +Vpp and the ground voltage. Thus, no negative bias voltage is applied to the array control gate lines ACG1 and ACG2 and the tunneling line TUN to program the single poly NVM cell 100.

The positive program voltage +Vpp applied to the first array control gate line ACG1 may be transmitted to the first N-type well region 141, and the positive program voltage +Vpp applied to the second array control gate line ACG2 may be transmitted to the second N-type well region 142. In such a case, a positive coupling voltage +Vcoupling may be induced at the floating gate 130 of the single poly NVM cell 100 by the positive program voltage +Vpp applied to the first and second array control gate lines ACG1 and ACG2.

Capacitance values of the capacitive elements coupled in parallel to the floating gate 130 may include a capacitance value C1 of the first capacitive element 230, a capacitance value C2 of the second capacitive element 240 and a capacitance value C3 of the third capacitive element 250. In such a case, the coupling voltage +Vcoupling induced at the floating gate 130 may be approximately calculated by the following equation 1.

$$+Vcoupling = +Vpp \times ((C1+C2)/(C1+C2+C3)) \quad \text{(Equation 1)}$$

If a sum of the capacitance values C1 and C2 is greater than the capacitance value C3, the coupling voltage +Vcoupling may be closer to the positive program voltage +Vpp than the ground voltage. For example, if the positive program voltage +Vpp is +20 volts and the value of "(C1+2)/(C1+C2+C3)" corresponding to a cell coupling ratio is greater than about 90%, the coupling voltage +Vcoupling induced at the floating gate 130 may be higher than about +18 volts.

As described above, the positive program voltage +Vpp applied to the first and second array control gate lines ACG1 and ACG2 may induce the coupling voltage +Vcoupling at the floating gate 130 of the single poly NVM cell 100. The ground voltage applied to the tunneling line TUN may be transmitted to the third N-type well region 143 through the third N-type contact region 153, as illustrated in FIG. 6. In addition, the coupling voltage +Vcoupling may be transmitted to the third portion 133 of the floating gate 130, which is located on the third active region 113. Thus, a potential difference corresponding to the coupling voltage +Vcoupling may be created across the second gate insulation layer 139 between the floating gate 130 and the third N-type well region 143.

In such a case, electrons in the third N-type well region 143 may be injected into the floating gate 130 through the second gate insulation layer 139 due to an F-N tunneling mechanism. When the electrons in the third N-type well region 143 are injected into the floating gate 130 by the F-N tunneling mechanism, a threshold voltage of a MOS structure, which is comprised of the second channel region 122, the second gate insulation layer 139 and the fourth portion 134 of the floating gate 130, may become higher. As a result, the single poly NVM cell 100 may be programmed so that the N-channel floating gate transistor (210 of FIG. 4) is in an off-state for example, a positive threshold voltage.

Figure 7:
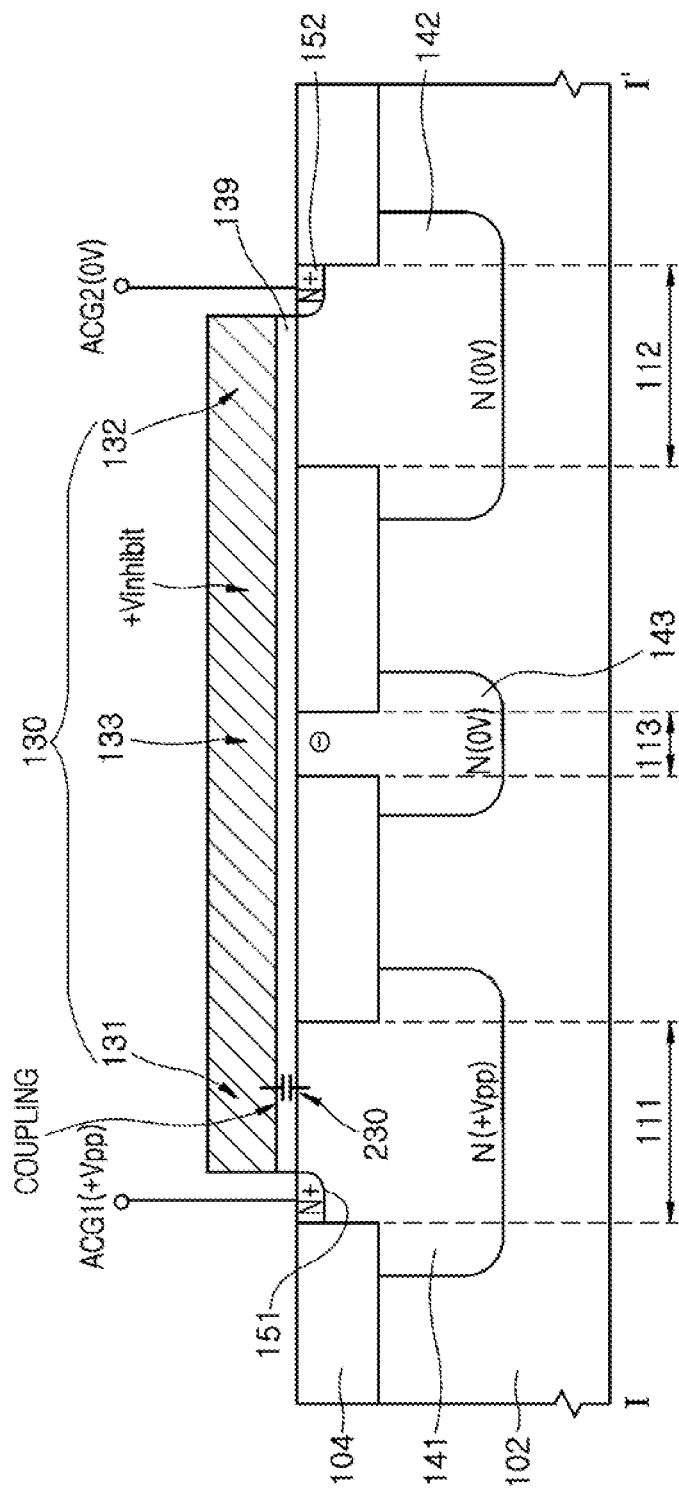
FIGS. 7 and 8 cross-sectional views each of which illustrates a program inhibition operation of a single poly NVM cell according to an embodiment.

FIG. 7 is a cross-sectional view illustrating a first program inhibition operation of the single poly NVM cell 100 according to an embodiment. The cross-sectional view of FIG. 7 is a cross-sectional view taken along the line I-I' of FIG. 1. In FIG. 7, the same reference numerals or designators as used in FIGS. 1 to 4 denote the same elements.

Referring to FIGS. 1 and 7, when the positive program voltage +Vpp is applied to the first array control gate line ACG1 and the ground voltage is applied to both of the second array control gate line ACG2 and the tunneling line TUN, the program of the single poly NVM cell 100 may be prohibited by a first program inhibition operation. During the first program inhibition operation, the word line WL corresponding to the word/selection line WL/SEL of FIG. 4 and the bit line BL may be floated. In the first program inhibition operation of the single poly NVM cell 100, only two different voltages such as the positive program voltage +Vpp and the ground voltage may be used to prevent the single poly NVM cell 100 from being programmed. Thus, no negative bias voltage is applied to the array control gate lines ACG1 and ACG2 and the tunneling line TUN during the first program inhibition operation of the single poly NVM cell 100.

The positive program voltage +Vpp applied to the first array control gate line ACG1 may be transmitted to the first N-type well region 141, and the ground voltage applied to the second array control gate line ACG2 may be transmitted to the second N-type well region 142. In addition, the ground voltage applied to the tunneling line TUN may be transmitted to the third N-type well region 143. In such a case, a first inhibition voltage +Vinhibit may be induced at the floating gate 130 by the positive program voltage +Vpp applied to the first array control gate line ACG1. The first inhibition voltage +Vinhibit which is induced at the floating gate 130 may be expressed by the following equation 2.

$$+Vinhibit = +Vpp \times \{C1/(C1+C2+C3)\} \quad \text{(Equation 2)}$$

When the capacitance value C1 of the first capacitive element 230 is substantially equal to the capacitance value C2 of the second capacitive element 240 and the capacitance value C3 of the third capacitive element 250 is negligible, the first inhibition voltage +Vinhibit may be a half of the positive program voltage +Vpp.

As described above, the positive program voltage +Vpp applied to the first array control gate line ACG1 and the ground voltage applied to the second array control gate line ACG2 and the tunneling line TUN may induce the first inhibition voltage +Vinhibit at the floating gate 130 of the single poly NVM cell 100. The ground voltage applied to the tunneling line TUN may be transmitted to the third N-type well region 143 through the third N-type contact region 153. In addition, the first inhibition voltage +Vinhibit may be transmitted to the third portion 133 of the floating gate 130, which is located on the third active region 113. Thus, a potential difference corresponding to the first inhibition voltage +Vinhibit, for example, a half of the positive program voltage +Vpp (+Vpp/2), may be created across the second gate insulation layer 139 between the floating gate 130 and the third N-type well region 143.

The half of the positive program voltage +Vpp (+Vpp/2) may be insufficient to cause an F-N tunneling phenomenon in the second gate insulation layer 139 between the floating gate 130 and the third N-type well region 143. Accordingly, the program operation of the single poly NVM cell 100 may be inhibited and a threshold voltage of the N-channel floating gate transistor (210 of FIG. 4) does not change.

Figure 8:
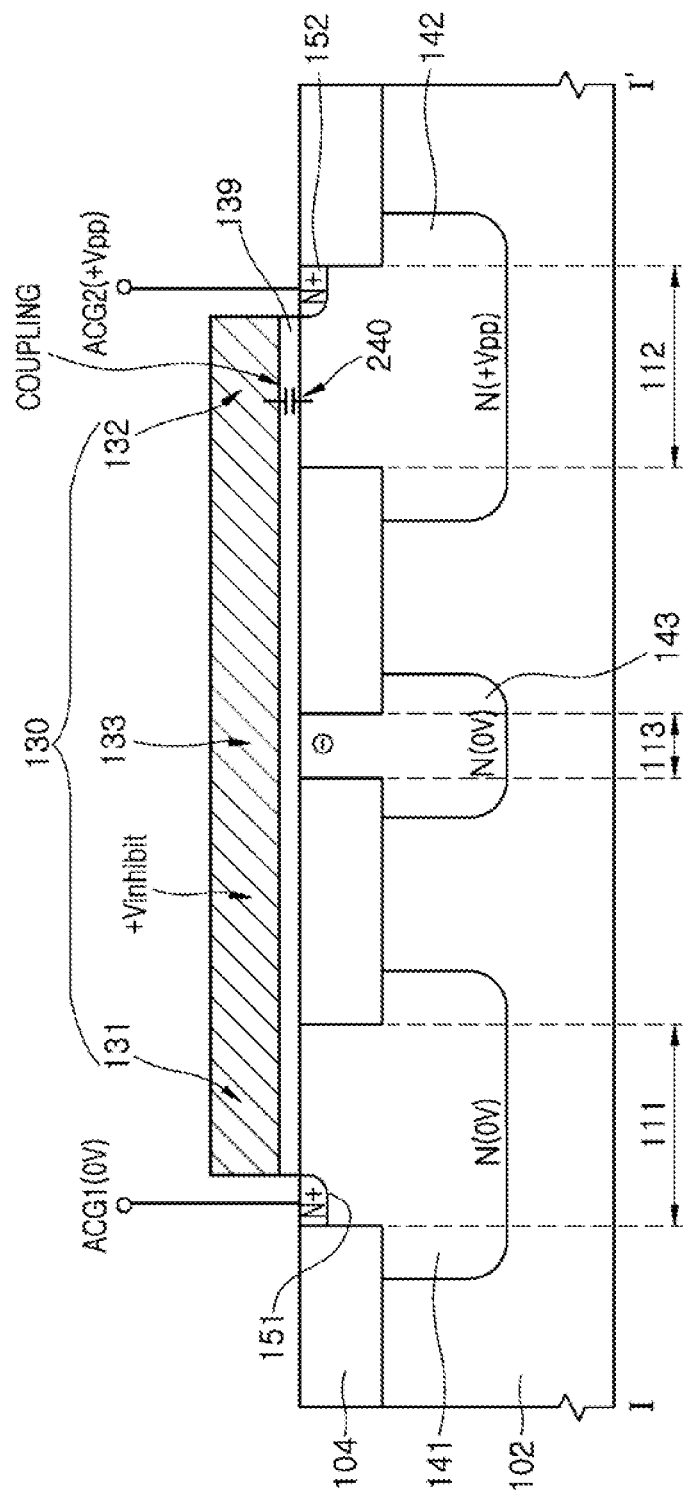

FIG. 8 is a cross-sectional view illustrating a second program inhibition operation of the single poly NVM cell 100 according to an embodiment. The cross-sectional view of FIG. 8 is a cross-sectional view taken along the line I-I' of FIG. 1. In FIG. 8, the same reference numerals or designators as used in FIGS. 1 to 4 denote the same elements.

Referring to FIGS. 1 and 8, when the positive program voltage +Vpp is applied to the second array control gate line ACG2 and the ground voltage is applied to both of the first array control gate line ACG1 and the tunneling line TUN, the program of the single poly NVM cell 100 may be prohibited by a second program inhibition operation. During the second program inhibition operation, the word line WL corresponding to the word/selection line WL/SEL of FIG. 4 and the bit line BL may be floated. In the second program inhibition operation of the single poly NVM cell 100, only two different voltages such as the positive program voltage +Vpp and the ground voltage may be used to prevent the single poly NVM cell 100 from being programmed. Thus, no negative bias voltage is applied to the array control gate lines ACG1 and ACG2 and the tunneling line TUN during the second program inhibition operation of the single poly NVM cell 100.

The positive program voltage +Vpp applied to the second array control gate line ACG2 may be transmitted to the second N-type well region 142, and the ground voltage applied to the first array control gate line ACG1 may be transmitted to the first N-type well region 141. In addition, the ground voltage applied to the tunneling line TUN may be transmitted to the third N-type well region 143. In such a case, a second inhibition voltage +Vinhibit may be induced at the floating gate 130 by the positive program voltage +Vpp applied to the second array control gate line ACG2. The second inhibition voltage +Vinhibit induced at the floating gate 130 may be expressed by the following equation 3.

$$+Vinhibit = +Vpp \times \{C2/(C1+C2+C3)\} \quad \text{(Equation 3)}$$

When the capacitance value C1 of the first capacitive element 230 is substantially equal to the capacitance value C2 of the second capacitive element 240 and the capacitance value C3 of the third capacitive element 250 is negligible, the second inhibition voltage +Vinhibit may be a half of the positive program voltage +Vpp.

As described above, the positive program voltage +Vpp applied to the second array control gate line ACG2 and the ground voltage applied to the first array control gate line ACG1 and the tunneling line TUN may induce the second inhibition voltage +Vinhibit at the floating gate 130 of the single poly NVM cell 100. The ground voltage applied to the tunneling line TUN may be transmitted to the third N-type well region 143 through the third N-type contact region 153. In addition, the second inhibition voltage +Vinhibit may be transmitted to the third portion 133 of the floating gate 130, which is located on the third active region 113. Thus, a potential difference corresponding to the second inhibition voltage +Vinhibit, for example, a half of the positive program voltage +Vpp (+Vpp/2), may be created across the second gate insulation layer 139 between the floating gate 130 and the third N-type well region 143.

The half of the positive program voltage +Vpp (+Vpp/2) may be insufficient to cause an F-N tunneling phenomenon in the second gate insulation layer 139 between the floating gate 130 and the third N-type well region 143. Accordingly, the program operation of the single poly NVM cell 100 may be inhibited and a threshold voltage of the N-channel floating gate transistor (210 of FIG. 4) is maintained unchanged.

In summary, the single poly NVM cell 100 may be selectively programmed only when the positive program voltage +Vpp is applied to both of the first and second array control gate lines ACG1 and ACG2 and the tunneling line TUN is grounded. That is, when the positive program voltage +Vpp is applied to only one of the first and second array control gate lines ACG1 and ACG2, the program of the single poly NVM cell 100 may be prohibited. Thus, when a plurality of single poly NVM cells 100 are repeatedly arrayed in rows and columns to form a plurality of single poly NVM cells 100 which are respectively located at cross points of first array control gate lines ACG1 and second array control gate lines ACG2 intersecting the first array control gate lines ACG1, it may be possible to selectively program any one of the plurality of single poly NVM cells 100 without programming non-selected single poly NVM cells 100.

Figure 9:
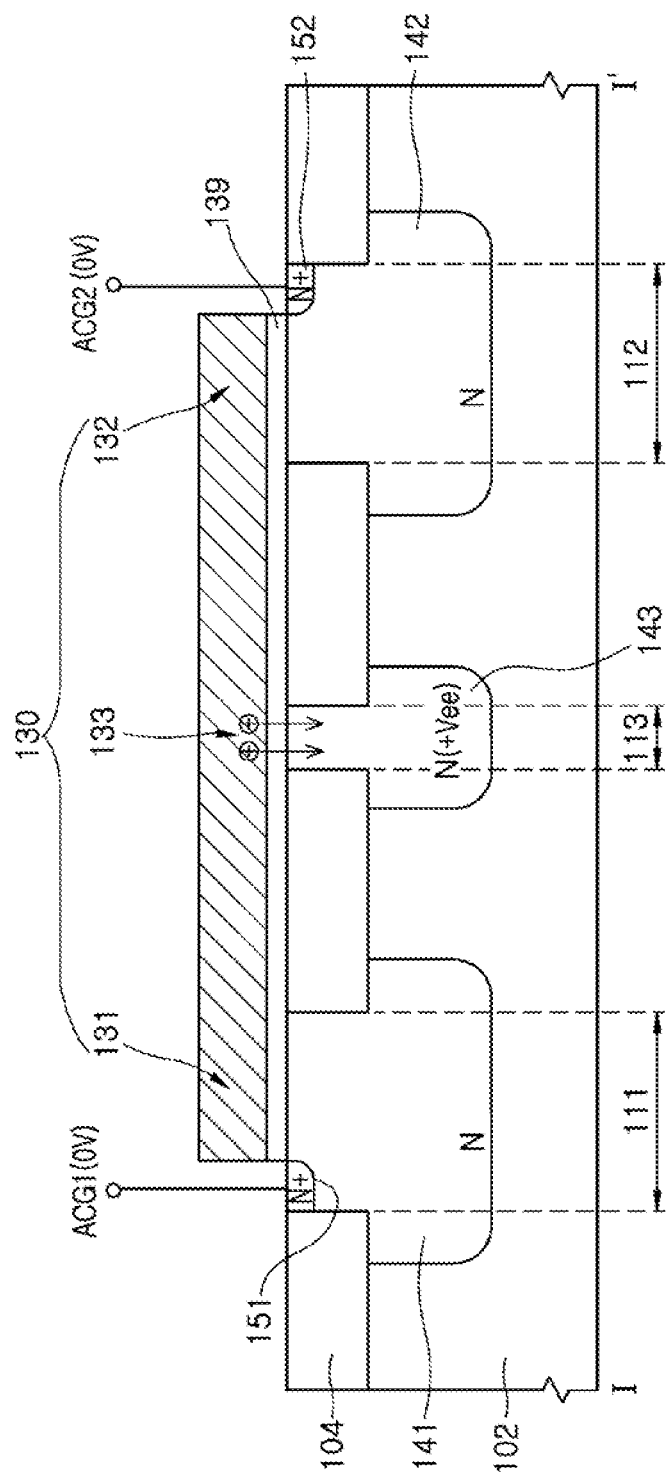
FIGS. 9 and 10 are cross-sectional views each of which illustrates an erasure operation of a single poly NVM cell according to an embodiment.
Figure 10:
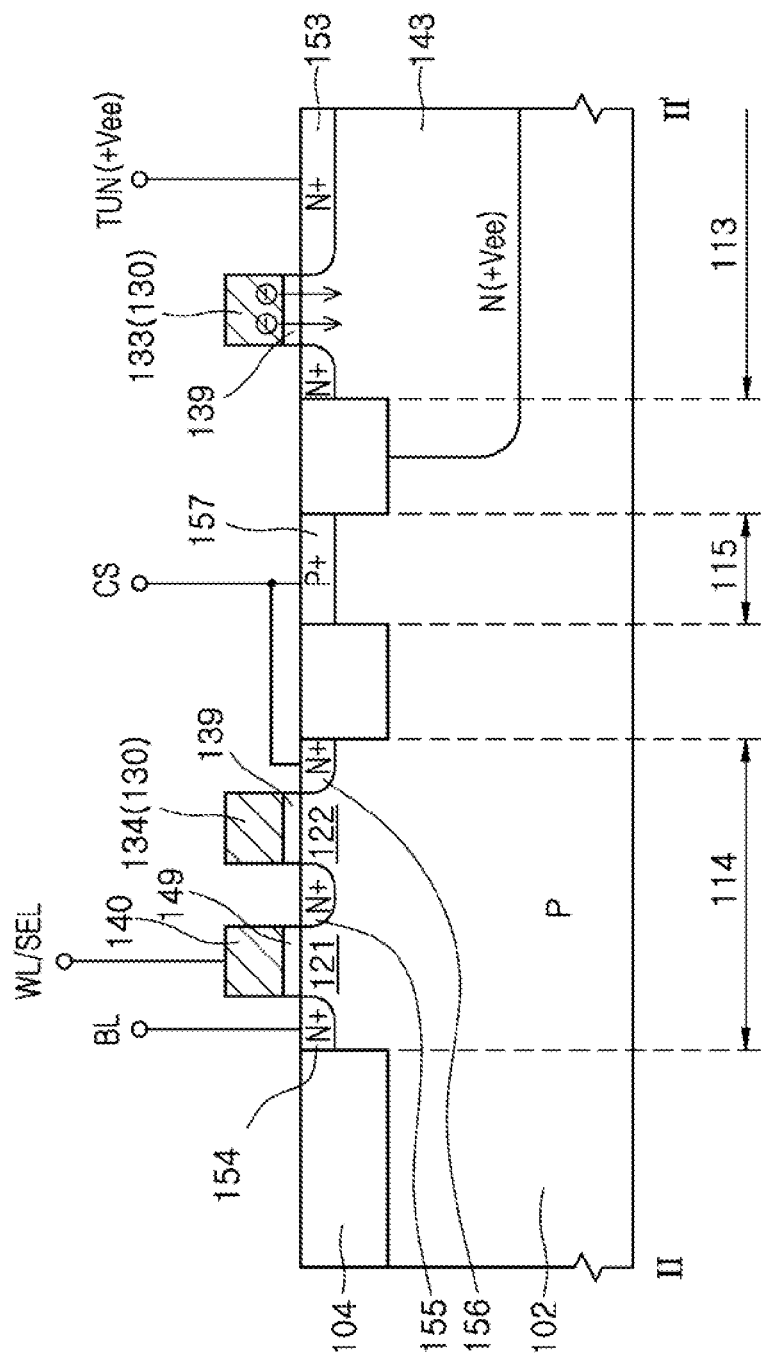

FIGS. 9 and 10 are cross-sectional views illustrating an erasure operation of the single poly NVM cell 100 according to an embodiment. The cross-sectional view of FIG. 9 is a cross-sectional view taken along the line I-I' of FIG. 1, and the cross-sectional view of FIG. 10 is a cross-sectional view taken along the line II-II' of FIG. 1. In FIGS. 9 and 10, the same reference numerals or designators as used in FIGS. 1 to 4 denote the same elements.

Referring to FIGS. 9 and 10, to execute the erasure operation of the single poly NVM cell 100, the ground voltage may be applied to both of the first and second array control gate lines ACG1 and ACG2 and a positive erasure voltage +Vee may be applied to the tunneling line TUN. During the erasure operation, the word/selection line WL/SEL and the bit line BL may be floated. Since the word/selection line WL/SEL is floated, the erasure operation of the single poly NVM cell 100 may not be affected by the N-channel read/selection transistor 220 that is comprised of the N-type drain region 154, the first channel region 121, the N-type junction region 155, the first gate insulation layer 149 and the read/selection gate 140.

In the erasure operation according to the present embodiment, only two different voltages such as the positive erasure voltage +Vee and the ground voltage may be used to erase the single poly NVM cell 100. The positive erasure voltage +Vee may have the same voltage level as the positive program voltage +Vpp. That is, the erasure operation of the single poly NVM cell 100 may be achieved using only the positive erasure voltage +Vee and the ground voltage. Accordingly, no negative bias voltage is required to erase the single poly NVM cell 100. The positive erasure voltage +Vee applied to the tunneling line TUN may be determined to have a sufficient level to cause an F-N tunneling phenomenon that electrons in the floating gate 130 are injected into the third N-type well region 143 through the second gate insulation layer 139. In some embodiments, the positive erasure voltage +Vee may be set to be approximately +20 volts.

The ground voltage applied to the first array control gate line ACG1 may be transmitted to the first N-type well region 141, and the ground voltage applied to the second array control gate line ACG2 may be transmitted to the second N-type well region 142. The positive erasure voltage +Vee applied to the tunneling line TUN may be transmitted to the third N-type well region 143 through the third N-type contact region 153, as illustrated in FIG. 10. In such a case, a voltage close to the ground voltage may be induced at the floating gate 130 of the single poly NVM cell 100. Thus, a potential difference corresponding to about the positive erasure voltage +Vee may be created across the second gate insulation layer 139 between the floating gate 130 and the third N-type well region 143. Accordingly, electrons in the third portion 133 of the floating gate 130 may be injected into the third N-type well region 143 through the second gate insulation layer 139 by an F-N tunneling mechanism.

When the electrons in the floating gate 130 are injected into the third N-type well region 143 by the F-N tunneling mechanism, a threshold voltage of a MOS structure, which is comprised of the second channel region 122, the second gate insulation layer 139 and the fourth portion 134 of the floating gate 130, may be lowered. As a result, the single poly NVM cell 100 may be erased so that the N-channel floating gate transistor (210 of FIG. 4) is in on-state for example, a negative threshold voltage.

Figure 11:
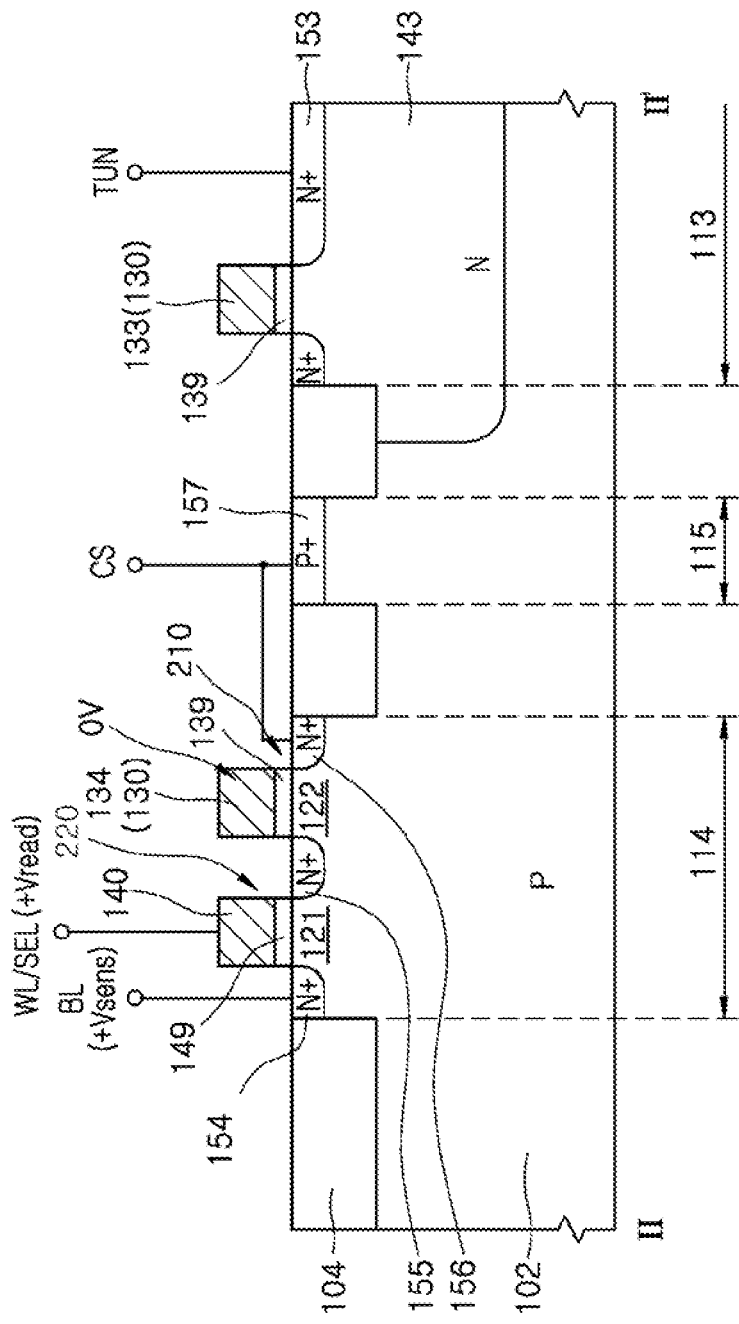
FIG. 11 is a cross-sectional view illustrating a read operation of a single poly NVM cell according to an embodiment.

FIG. 11 is a cross-sectional view illustrating a read operation of the single poly NVM cell 100 according to an embodiment. The cross-sectional view of FIG. 11 is a cross-sectional view taken along the line II-II' of FIG. 1. In FIG. 11, the same reference numerals or designators as used in FIGS. 1 to 4 denote the same elements.

Referring to FIGS. 1 and 11, to execute the read operation of the single poly NVM cell 100, the ground voltage may be applied to both of the first and second array control gate lines ACG1 and ACG2 and a positive read voltage +Vread may be applied to the word/selection line WL/SEL that is, the read/selection gate 140. In some embodiments, the positive read voltage +Vread may be about 5 volts. In addition, a positive sensing voltage +Vsens, for example, +1 volt may be applied to the bit line BL. During the read operation, the tunneling line TUN may be grounded or floated, and the common source line CS may be grounded. When the ground voltage is applied to the first and second array control gate lines ACG1 and ACG2, a voltage close to the ground voltage may be induced at the floating gate 130.

In the read operation according to the present embodiment, the N-channel read/selection transistor (220 of FIG. 4), which is comprised of the N-type drain region 154, the first channel region 121, the N-type junction region 155, the first gate insulation layer 149 and the read/selection gate 140, may be turned on by the positive read voltage +Vread applied to the word/selection line WL/SEL and the positive sensing voltage +Vsens applied to the bit line BL. Thus, the positive sensing voltage +Vsens applied to the bit line BL may be transmitted to the N-type junction region 155.

When the single poly NVM cell 100 is in an erased state so that the N-channel floating gate transistor 210 has a negative threshold voltage, an N-type inversion may occur in the second channel region 122. Thus, since a voltage close to the ground voltage is induced at the floating gate 130 during the read operation, the N-type inversion in the second channel region 122 may still exist during the read operation. As a result, electrons may be drifted from the N-type source region 156 toward the N-type drain region 154 through the second channel region 122 and the N-type junction region 155, and movement of the electrons may generate a current flowing through the bit line BL.

In contrast, when the single poly NVM cell 100 has a programmed state so that the N-channel floating gate transistor 210 has a positive threshold voltage, no N-type inversion is formed in the second channel region 122. That is, since a voltage close to the ground voltage is induced at the floating gate 130 during the read operation, no N-type inversion may be formed in the second channel region 122 during the read operation. As a result, no current may flow through the bit line BL during the read operation. Accordingly, it may be possible to read out information stored in the single poly NVM cell 100 by sensing whether a current flows through the bit line BL or not.

Figure 12:
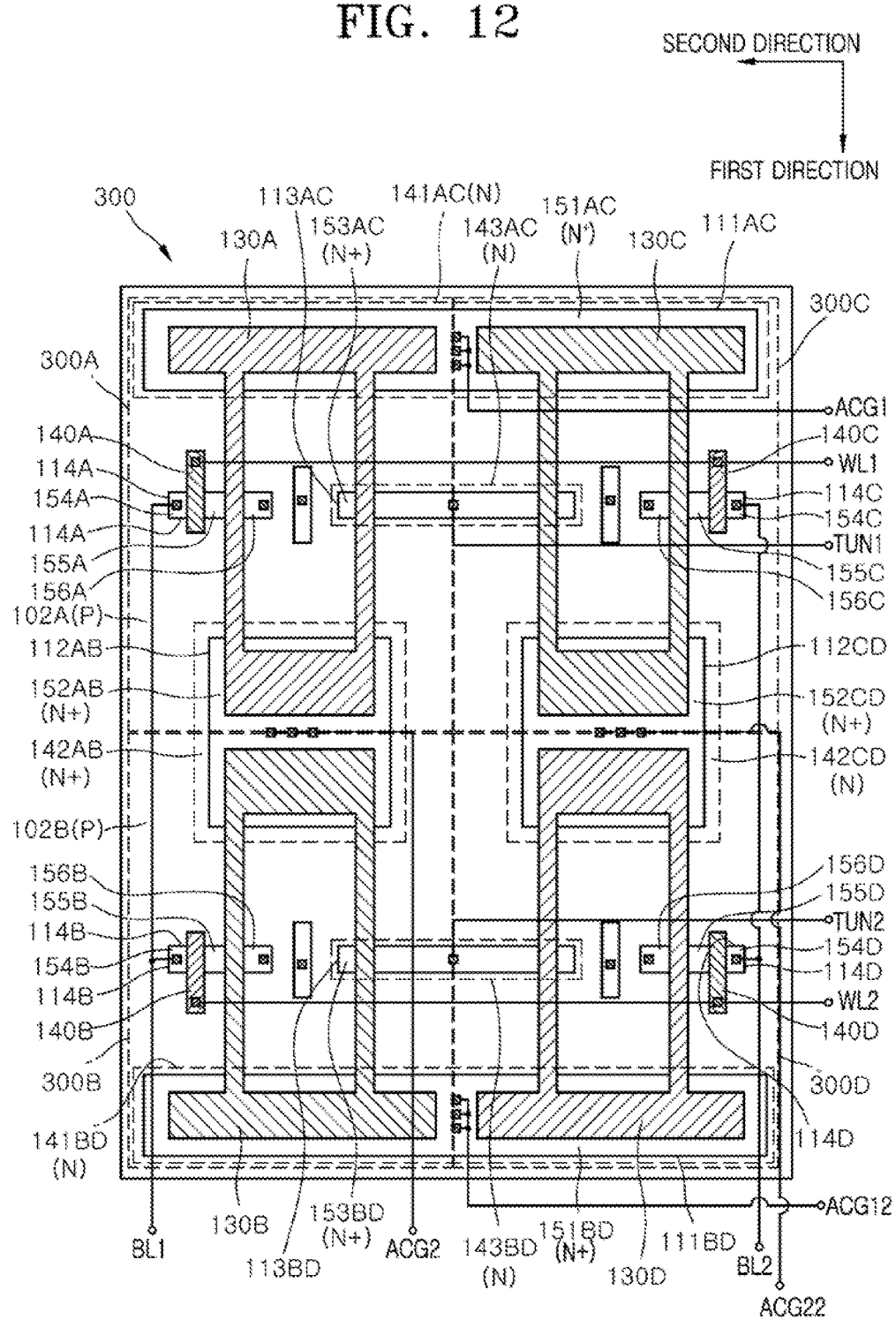
FIG. 12 is a layout diagram illustrating a single poly NVM cell array according to an embodiment.

FIG. 12 is a layout diagram illustrating a single poly NVM cell array 300 according to an embodiment. Referring to FIG. 12, the single poly NVM cell array 300 may include a plurality of unit cells 300A, 300B, 300C and 300D. The plurality of unit cells 300A, 300B, 300C and 300D may be located at cross points of a plurality of rows and a plurality of columns, respectively. For example, the first unit cell 300A may be located at a cross point of a first row and a first column, and the second unit cell 300B may be located at a cross point of a second row and the first column. In addition, the third unit cell 300C may be located at a cross point of the first row and a second column, and the fourth unit cell 300D may be located at a cross point of the second row and the second column.

Each of the first to fourth unit cells 300A, 300B, 300C and 300D may have substantially the same configuration as the single poly NVM cell 100 described with reference to FIGS. 1, 2 and 3. Thus, a detailed description of each of the first to fourth unit cells 300A, 300B, 300C and 300D constituting the single poly NVM cell array 300 will be omitted hereinafter. Although FIG. 12 illustrates an example in which the single poly NVM cell array 300 includes the four unit cells 300A, 300B, 300C and 300D, the present disclosure is not limited thereto. For example, in some embodiments, the single poly NVM cell array 300 may be repeated and may include any number of unit cells, for example, eight or more unit cells.

The second unit cell 300B may have a symmetric layout to the first unit cell 300A with respect to a straight line (not shown) that passes through a central point of the single poly NVM cell array 300 and extends in the second direction. The third unit cell 300C may have a symmetric layout to the first unit cell 300A with respect to a straight line (not shown) that passes through a central point of the single poly NVM cell array 300 and extends in the first direction. The fourth unit cell 300D may have a symmetric layout to the second unit cell 300B with respect to a straight line (not shown) that passes through a central point of the single poly NVM cell array 300 and extends in the first direction. The fourth unit cell 300D may have a symmetric layout to the third unit cell 300C with respect to a straight line (not shown) that passes through a central point of the single poly NVM cell array 300 and extends in the second direction.

The first and third unit cells 300A and 300C may be coupled to a first array control gate line ACG1 in common. The second and fourth unit cells 300B and 300D may be coupled to a third array control gate line ACG12 in common. The first and third unit cells 300A and 300C may share a first N-type well region 141AC coupled to the first array control gate line ACG1. The second and fourth unit cells 300B and 300D may share a first N-type well region 141BD coupled to the third array control gate line ACG12.

The first N-type well region 141AC shared by the first and third unit cells 300A and 300C may have a rectangular shape extending in the second direction and may be located in both regions of the first and third unit cells 300A and 300C. The first N-type well region 141BD shared by the second and fourth unit cells 300B and 300D may have a rectangular shape extending in the second direction and may be located in both regions of the second and fourth unit cells 300B and 300D.

The first N-type well region 141AC and the first N-type well region 141BD may face each other and be spaced apart from each other in the first direction. The first N-type well region 141AC and the first N-type well region 141BD may be symmetric to each other with respect to a straight line (not shown) that passes through a central point of the single poly NVM cell array 300 and extends in the second direction.

First active regions 111AC and 111BD may be disposed in the first N-type well regions 141AC and 141BD, respectively. First N-type contact regions 151AC and 151BD may be disposed in the first active regions 111AC and 111BD, respectively. The first unit cell 300A may share the first N-type well region 141AC and the first N-type contact region 151AC with the third unit cell 300C. The second unit cell 300B may share the first N-type well region 141BD and the first N-type contact region 151BD with the fourth unit cell 300D.

The first active regions 111AC and 111BD may face each other and be spaced apart from each other in the first direction. The first active regions 111AC and 111BD may be symmetric to each other with respect to a straight line (not shown) that passes through a central point of the single poly NVM cell array 300 and extends in the second direction. The first N-type contact regions 151AC and 151BD may face each other and be spaced apart from each other in the first direction. The first N-type contact regions 151AC and 151BD may be symmetric to each other with respect to a straight line (not shown) that passes through a central point of the single poly NVM cell array 300 and extends in the second direction.

The first and second unit cells 300A and 300B may be coupled to a second array control gate line ACG2 in common. The second array control gate line ACG2 may be parallel with the first direction and intersect the first array control gate line ACG1. The first unit cell 300A may be located at a cross point of the first and second array control gate lines ACG1 and ACG2 and may be coupled to the first and second array control gate lines ACG1 and ACG2.

The third and fourth unit cells 300C and 300D may be coupled to a fourth array control gate line ACG22 in common. The fourth array control gate line ACG22 may be parallel with the first direction and intersect the third array control gate line ACG12. The fourth unit cell 300D may be located at a cross point of the third and fourth array control gate lines ACG12 and ACG22 and may be coupled to the third and fourth array control gate lines ACG12 and ACG22. The second unit cell 300B may be located at a cross point of the second and third array control gate lines ACG2 and ACG12 and may be coupled to the second and third array control gate lines ACG2 and ACG12. The third unit cell 300C may be located at a cross point of the first and fourth array control gate lines ACG1 and ACG22 and may be coupled to the first and fourth array control gate lines ACG1 and ACG22.

The first and second unit cells 300A and 300B may share a second N-type well region 142AB coupled to the second array control gate line ACG2. The third and fourth unit cells 300C and 300D may share a second N-type well region 142CD coupled to the fourth array control gate line ACG22. The second N-type well region 142AB shared by the first and second unit cells 300A and 300B may have a rectangular shape extending in the first direction and may be located in both regions of the first and second unit cells 300A and 300B. The second N-type well region 142CD shared by the third and fourth unit cells 300C and 300D may have a rectangular shape extending in the first direction and may be located in both regions of the third and fourth unit cells 300C and 300D.

The second N-type well region 142AB and the second N-type well region 142CD may face each other and be spaced apart from each other in the second direction. The second N-type well region 142AB and the second N-type well region 142CD may be symmetric to each other with respect to a straight line (not shown) that passes through a central point of the single poly NVM cell array 300 and extends in the first direction.

Second active regions 112AB and 112CD may be disposed in the second N-type well regions 142AB and 142CD, respectively. Second N-type contact regions 152AB and 152CD may be disposed in the second active regions 112AB and 112CD, respectively. The first unit cell 300A may share the second N-type well region 142AB and the second N-type contact region 152AB with the second unit cell 300B, and the third unit cell 300C may share the second N-type well region 142CD and the second N-type contact region 152CD with the fourth unit cell 300D.

The second active regions 112AB and 112CD may face each other and be spaced apart from each other in the second direction. The second active regions 112AB and 112CD may be symmetric to each other with respect to a straight line (not shown) that passes through a central point of the single poly NVM cell array 300 and extends in the first direction. The second N-type contact regions 152AB and 152CD may face each other and be spaced apart from each other in the second direction. The second N-type contact regions 152AB and 152CD may be symmetric to each other with respect to a straight line (not shown) that passes through a central point of the single poly NVM cell array 300 and extends in the first direction.

The first and third unit cells 300A and 300C may be coupled to a first tunneling line TUN1 in common, and the second and fourth unit cells 300B and 300D may be coupled to a second tunneling line TUN2 in common. The first and second tunneling lines TUN1 and TUN2 may extend in the second direction and be parallel to the first and third array control gate lines ACG1 and ACG12.

The first and third unit cells 300A and 300C may share a third N-type well region 143AC coupled to the first tunneling line TUN1. The second and fourth unit cells 300B and 300D may share a third N-type well region 143BD coupled to the second tunneling line TUN2. The third N-type well region 143AC shared by the first and third unit cells 300A and 300C may have a stripe shape extending in the second direction and may be located in both regions of the first and third unit cells 300A and 300C. The third N-type well region 143BD shared by the second and fourth unit cells 300B and 300D may have a stripe shape extending in the second direction and may be located in both regions of the second and fourth unit cells 300B and 300D.

The third N-type well region 143AC and the third N-type well region 142BD may face each other and be spaced apart from each other in the first direction. The third N-type well region 143AC and the third N-type well region 143BD may be symmetric to each other with respect to a straight line (not shown) that passes through a central point of the single poly NVM cell array 300 and extends in the second direction. The third N-type well region 143AC may be disposed between the first N-type well region 141AC and the second N-type well regions 142AB and 142CD, and the third N-type well region 143BD may be disposed between the first N-type well region 141BD and the second N-type well regions 142AB and 142CD.

Third active regions 113AC and 113BD may be disposed in the third N-type well regions 143AC and 143BD, respectively. Third N-type contact regions 153AC and 153BD may be disposed in the third active regions 113AC and 113BD, respectively. The first unit cell 300A may share the third N-type well region 143AC and the third N-type contact region 153AC with the third unit cell 300C, and the second unit cell 300B may share the third N-type well region 143BD and the third N-type contact region 153BD with the fourth unit cell 300D. The third active regions 113AC and 113BD may face each other and be spaced apart from each other in the first direction. The third active regions 113AC and 113BD may be symmetric to each other with respect to a straight line (not shown) that passes through a central point of the single poly NVM cell array 300 and extends in the second direction.

The first and second unit cells 300A and 300B may be coupled to a first bit line BL1 in common, and the third and fourth unit cells 300C and 300D may be coupled to a second bit line BL2 in common. The first and second bit lines BL1 and BL2 may extend in the first direction and be parallel to the second and fourth array control gate lines ACG2 and ACG22.

The first unit cell 300A may include a fourth active region 114A coupled to the first bit line BL1, and the second unit cell 300B may include a fourth active region 114B coupled to the first bit line BL1. The third unit cell 300C may include a fourth active region 114C coupled to the second bit line BL2, and the fourth unit cell 300D may include a fourth active region 114D coupled to the second bit line BL2. The fourth active regions 114A, 114B, 114C and 114D may be isolated from each other by an isolation layer (not shown). Each of the fourth active regions 114A, 114B, 114C and 114D may have a stripe shape extending in the second direction in a plan view.

An N-type drain region 154A, an N-type junction region 155A and an N-type source region 156A may be disposed in the fourth active region 114A spaced apart from each other. In addition, an N-type drain region 154B, an N-type junction region 155B and an N-type source region 156B may be disposed in the fourth active region 114B spaced apart from each other. Moreover, an N-type drain region 154C, an N-type junction region 155C and an N-type source region 156C may be disposed in the fourth active region 114C spaced apart from each other. Furthermore, an N-type drain region 154D, an N-type junction region 155D and an N-type source region 156D may be disposed in the fourth active region 114D spaced apart from each other.

The first bit line BL1 may be coupled to both of the N-type drain region 154A of the first unit cell 300A and the N-type drain region 154B of the second unit cell 300B, and the second bit line BL2 may be coupled to both of the N-type drain region 154C of the third unit cell 300C and the N-type drain region 154D of the fourth unit cell 300D.

A read/selection gate 140A may be disposed on the fourth active region 114A between the N-type drain region 154A and the N-type junction region 155A, and a read/selection gate 140B may be disposed on the fourth active region 114B between the N-type drain region 154B and the N-type junction region 155B. Similarly, a read/selection gate 140C may be disposed on the fourth active region 114C between the N-type drain region 154C and the N-type junction region 155C, and a read/selection gate 140D may be disposed on the fourth active region 114D between the N-type drain region 154D and the N-type junction region 155D.

A floating gate 130A may be disposed on the fourth active region 114A between the N-type source region 156A and the N-type junction region 155A, and a floating gate 130B may be disposed on the fourth active region 114B between the N-type source region 156B and the N-type junction region 155B. Similarly, a floating gate 130C may be disposed on the fourth active region 114C between the N-type source region 156C and the N-type junction region 155C, and a floating gate 130D may be disposed on the fourth active region 114D between the N-type source region 156D and the N-type junction region 155D.

A first word line WL1 also, referred to as a first word/selection line may be coupled to the read/selection gates 140A and 140C, and a second word line WL2 also, referred to as a second word/selection line may be coupled to the read/selection gates 140B and 140D. The first and second word lines WL1 and WL2 may intersect the first and second bit lines BL1 and BL2. The first to fourth unit cells 300A, 300B, 300C and 300D may be located at cross points of the word lines WL1 and WL2 and the bit lines BL1 and BL2, respectively.

Figure 13:
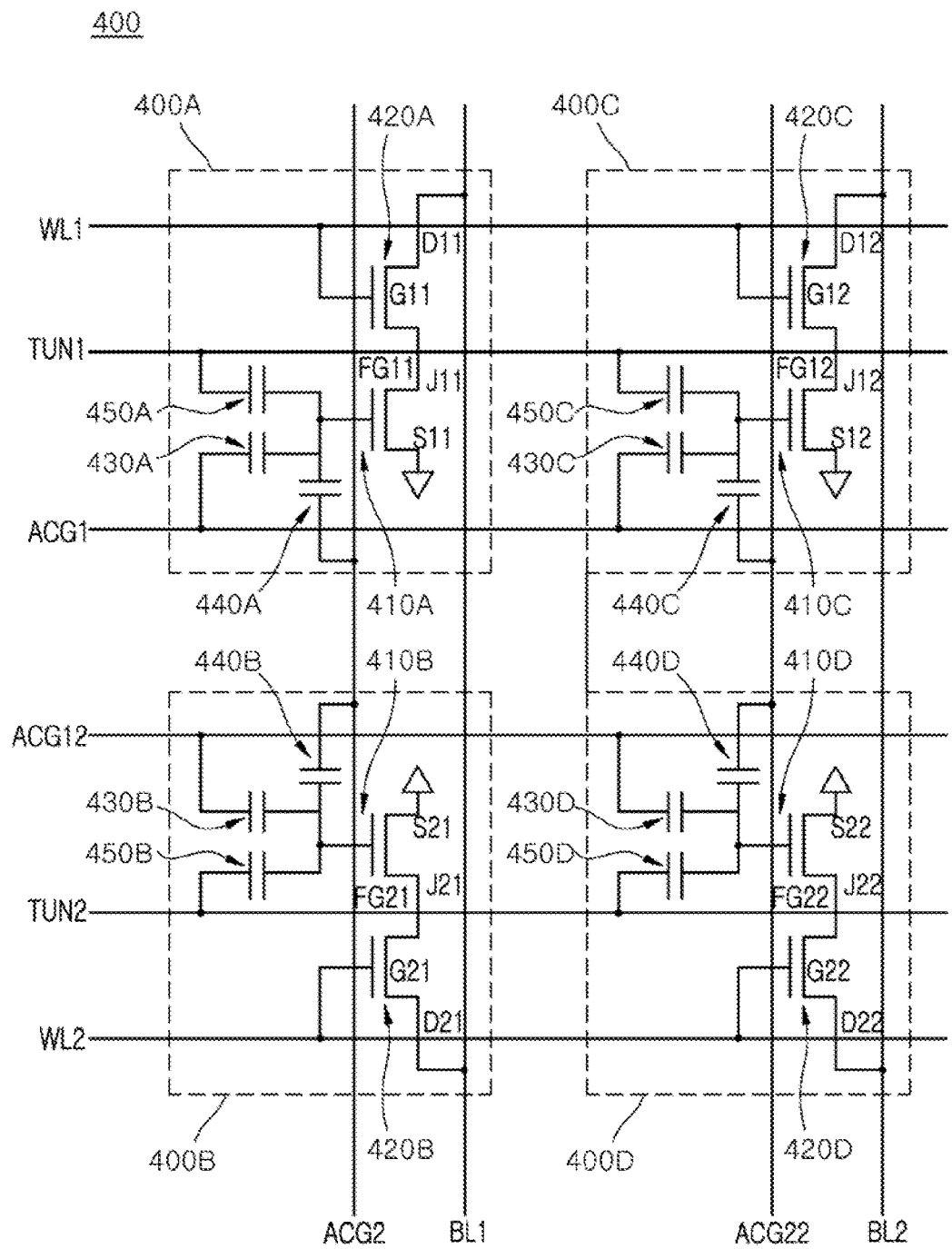
FIG. 13 is an equivalent circuit diagram of a single poly NVM cell array according to an embodiment.

FIG. 13 is a circuit diagram 400 of a single poly NVM cell array according to an embodiment. The circuit diagram 400 may be an equivalent circuit diagram of the single poly NVM cell array 300 described with reference to FIG. 12.

Referring to FIG. 13, when the first and third array control gate lines ACG1 and ACG12, the tunneling lines TUN1 and TUN2, and the word lines WL1 and WL2 are parallel in a row direction, the second and fourth array control gate lines ACG2 and ACG22 and the bit lines BL1 and BL2 may be parallel to a column direction. However, in some embodiments, disposition of the array control gate lines ACG1, ACG12, ACG2 and ACG22, the word lines WL1 and WL2, the bit lines BL1 and BL2, and the tunneling lines TUN1 and TUN2 may be different from or opposite to the above description.

A plurality of unit cells 400A, 400B, 400C and 400D may be located at cross points of the rows and the columns, respectively. Each of the unit cells 400A, 400B, 400C and 400D may have substantially the same configuration as the single poly NVM cell 200 described with reference to FIG. 4.

The first unit cell 400A may include an N-channel floating gate transistor 410A and an N-channel read/selection transistor 420A. The second unit cell 400B arrayed in the same column as the first unit cell 400A may include an N-channel floating gate transistor 410B and an N-channel read/selection transistor 420B. The third unit cell 400C arrayed in the same row as the first unit cell 400A may include an N-channel floating gate transistor 410C and an N-channel read/selection transistor 420C. The fourth unit cell 400D arrayed in the same column as the third unit cell 400C and disposed on a diagonal line with the first unit cell 400A may include an N-channel floating gate transistor 410D and an N-channel read/selection transistor 420D.

The N-channel read/selection transistor 420A may have a gate terminal G11, a drain terminal D11 and a junction terminal 311. The N-channel read/selection transistor 420B may have a gate terminal G21, a drain terminal D21 and a junction terminal 321. The N-channel read/selection transistor 420C may have a gate terminal G12, a drain terminal D12 and a junction terminal 312. The N-channel read/selection transistor 420D may have a gate terminal G22, a drain terminal D22 and a junction terminal 322.

The N-channel floating gate transistor 410A may have a floating gate FG11, a source terminal S11 and the junction terminal 311. The N-channel floating gate transistor 410B may have a floating gate FG21, a source terminal S21 and the junction terminal 321. The N-channel floating gate transistor 410C may have a floating gate FG12, a source terminal S12 and the junction terminal 312. The N-channel floating gate transistor 410D may have a floating gate FG22, a source terminal S22 and the junction terminal 322.

The gate terminals G11 and G12 of the first and third unit cells 400A and 400C arrayed in the first row may be coupled to the first word line WL1 in common. The gate terminals G21 and G22 of the second and fourth unit cells 400B and 400D arrayed in the second row may be coupled to the second word line WL2 in common.

The drain terminals D11 and D21 of the first and second unit cells 400A and 400B arrayed in the first column may be coupled to the first bit line BL1 in common. The drain terminals D12 and D22 of the third and fourth unit cells 400C and 400D arrayed in the second column may be coupled to the second bit line BL2 in common. The N-channel read/selection transistor 420A of the first unit cell 400A may be selected by the first word line WL1 and the first bit line BL1.

The floating gates FG11 and FG12 of the first and third unit cells 400A and 400C arrayed in the first row may be coupled to the first array control gate line ACG1 in common through first capacitive elements 430A and 430C, respectively. The floating gates FG11 and FG21 of the first and second unit cells 400A and 400B arrayed in the first column may be coupled to the second array control gate line ACG2 in common through second capacitive elements 440A and 440B, respectively.

The floating gates FG21 and FG22 of the second and fourth unit cells 400B and 400D arrayed in the second row may be coupled to the third array control gate line ACG12 in common through first capacitive elements 430B and 430D, respectively. The floating gates FG12 and FG22 of the third and fourth unit cells 400C and 400D arrayed in the second column may be coupled to the fourth array control gate line ACG22 in common through second capacitive elements 440C and 440D, respectively.

The floating gates FG11 and FG12 of the first and third unit cells 400A and 400C arrayed in the first row may be coupled to the first tunneling line TUN1 in common through third capacitive elements 450A and 450C, respectively. The floating gates FG21 and FG22 of the second and fourth unit cells 400B and 400D arrayed in the second row may be coupled to the second tunneling line TUN2 in common through third capacitive elements 450B and 450D, respectively.

The floating gate F11 of the first unit cell 400A may be coupled to the first array control gate line ACG1 through the first capacitive element 430A, may be coupled to the second array control gate line ACG2 through the second capacitive element 440A, and may be coupled to the first tunneling line TUN1 through the third capacitive element 450A.

Figure 14:
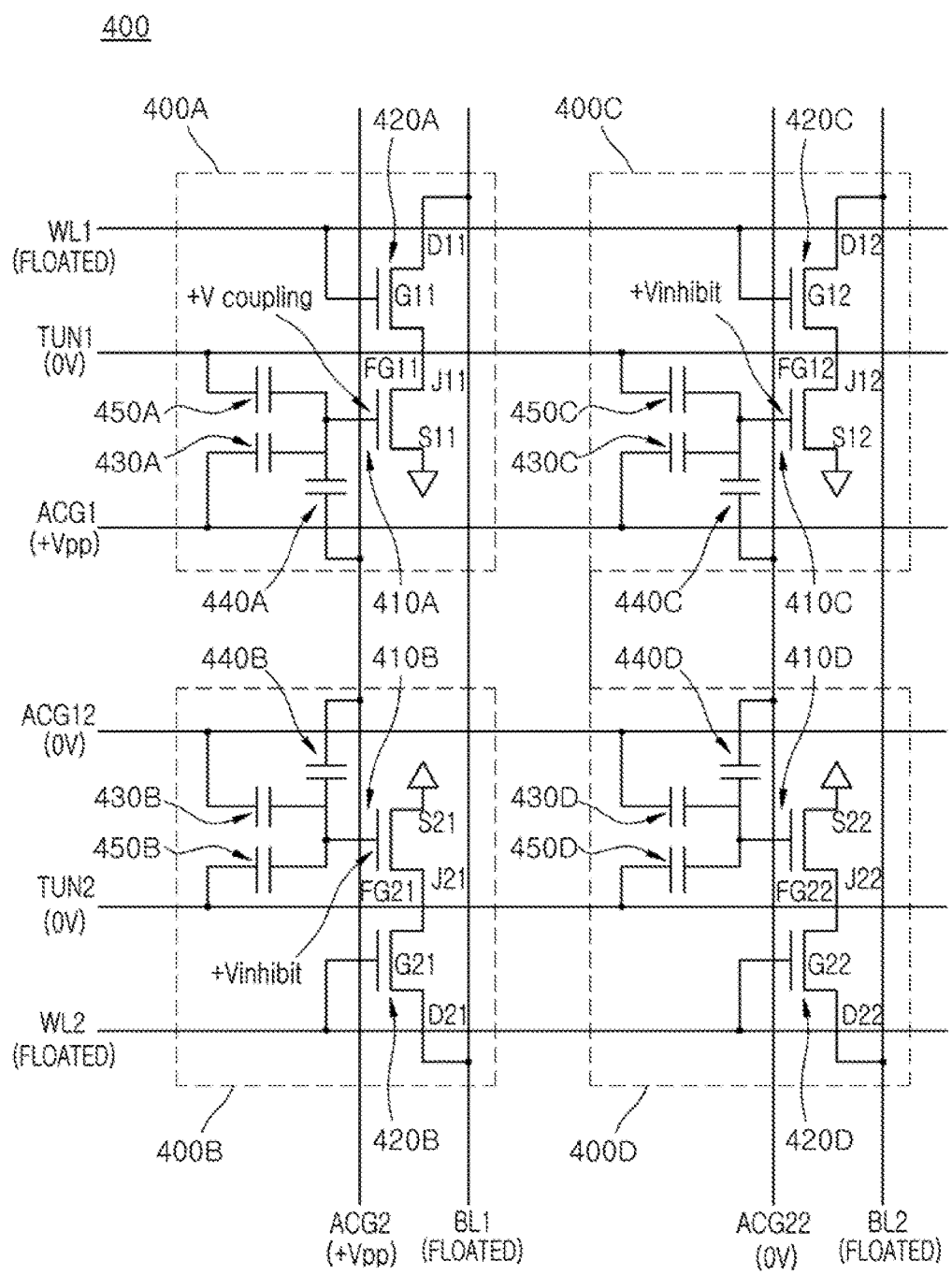
FIG. 14 is an equivalent circuit diagram illustrating a program operation of a selected unit cell in a single poly nonvolatile memory cell array according to an embodiment.

FIG. 14 is a circuit diagram illustrating a program operation of a selected unit cell in a single poly nonvolatile memory cell array according to an embodiment. In FIG. 14, the same reference numerals or designators as used in FIG. 13 denote the same elements.

Referring to FIG. 14, to program the first unit cell 400A, hereinafter, referred to as a selected unit cell located at a cross point of the first row and the first column, a positive program voltage +Vpp may be applied to the first and second array control gate lines ACG1 and ACG2 and a ground voltage may be applied to the first tunneling line TUN1 while all of the word lines WL1 and WL2 and all of the bit lines BL1 and BL2 are floated. In addition, the ground voltage used as a program inhibition voltage Vpinhibit may be applied to the third and fourth array control gate lines ACG12 and ACG22 and the second tunneling line TUN2.

In such a case, the second, third and fourth unit cells 400B, 400C and 400D connected to the third or fourth array control gate lines ACG12 and ACG22 may not be programmed and correspond to non-selected unit cells.

Under the above bias condition, a coupling voltage +Vcoupling may be induced at the floating gate FG11 of the selected unit cell 400A by the positive program voltage +Vpp applied to the first and second array control gate lines ACG1 and ACG2, as described with reference to FIGS. 5 and 6. Thus, electrons may be injected into the floating gate FG11 corresponding to the floating gate 130 of FIGS. 5 and 6 or the floating gate 130A of FIG. 12 by an F-N tunneling mechanism, and a threshold voltage of the N-channel floating gate transistor 410A of the selected unit cell 400A may become higher. As a result, the selected unit cell 400A may be selectively programmed and be placed in an off-state.

While the selected unit cell 400A is selectively programmed, a first inhibition voltage +Vinhibit corresponding to about a half of the positive program voltage +Vpp may be induced at the floating gate FG12 of the third unit cell 400C sharing the first array control gate line ACG1 with the selected unit cell 400A, as described with reference to FIG. 7. The first inhibition voltage +Vinhibit that is, +Vpp/2 may be insufficient to cause an F-N tunneling phenomenon in the third unit cell 400C. Thus, a threshold voltage of the N-channel floating gate transistor 410C of the third unit cell 400C may not change.

While the selected unit cell 400A is selectively programmed, a second inhibition voltage +Vinhibit corresponding to about a half of the positive program voltage +Vpp may be induced at the floating gate FG21 of the second unit cell 400B sharing the second array control gate line ACG2 with the selected unit cell 400A, as described with reference to FIG. 8. The second inhibition voltage +Vinhibit that is, +Vpp/2 may be insufficient to cause an F-N tunneling phenomenon in the second unit cell 400B. Thus, a threshold voltage of the N-channel floating gate transistor 410B of the second unit cell 400B may not change.

While the selected unit cell 400A is selectively programmed, a ground voltage may be induced at the floating gate FG22 of the fourth unit cell 400D since the third and fourth array control gate lines ACG12 and ACG22 and the second tunneling line TUN2 connected to the fourth unit cell 400D are grounded. Thus, no F-N tunneling phenomenon occurs in the fourth unit cell 400D. As a result, a threshold voltage of the N-channel floating gate transistor 410D of the fourth unit cell 400D may not change.

In summary, the first unit cell 400A may be selectively programmed when the positive program voltage +Vpp is applied only to the first and second array control gate lines ACG1 and ACG2. While the first unit cell 400A is selectively programmed, programs of the second, third and fourth unit cells 400B, 400C and 400D may be inhibited because at least one of two array control gate lines connected to each of the second, third and fourth unit cells 400B, 400C and 400D is grounded.

Figure 15:
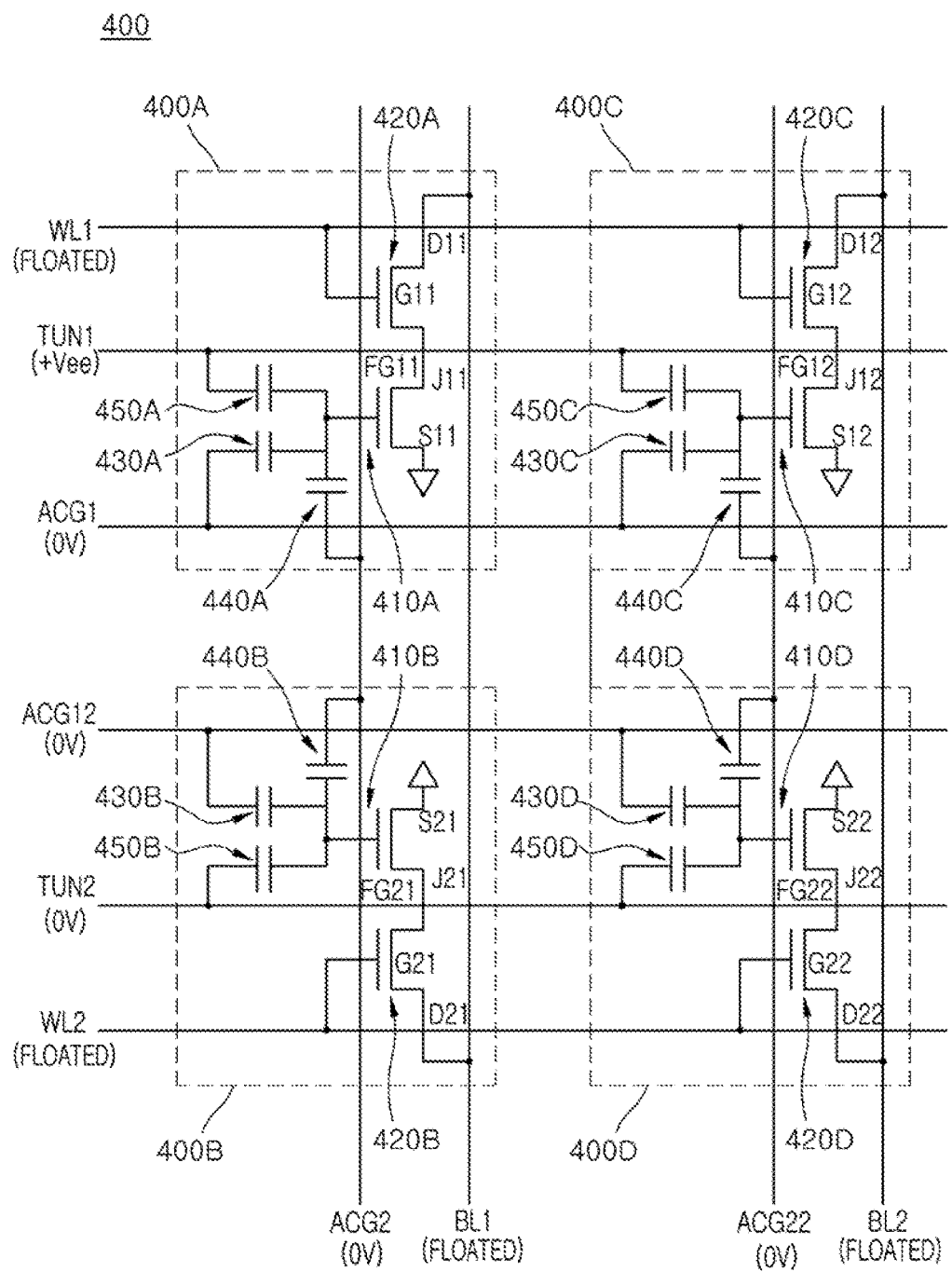
FIG. 15 is an equivalent circuit diagram illustrating an erasure operation of a single poly nonvolatile memory cell array according to an embodiment.

FIG. 15 is a circuit diagram illustrating an erasure operation of a single poly nonvolatile memory cell array according to an embodiment. In FIG. 15, the same reference numerals or designators as used in FIG. 13 denote the same elements. Referring to FIG. 15, the erasure operation of the single poly NVM cell array according to an embodiment may be executed by unit of page, each of which is comprised of unit cells arrayed in a single row.

To erase the unit cells 400A and 400C arrayed in the first row to share the first tunneling line TUN1, a positive erasure voltage +Vee may be applied to the first tunneling line TUN1 and a ground voltage may be applied to the first, second and fourth array control gate lines ACG1, ACG2 and ACG22 when all of the word lines WL1 and WL2 and all of the bit lines BL1 and BL2 are floated. In addition, the third array control gate line ACG12 and the second tunneling line TUN2 may be grounded.

Under the above erasure bias condition, a voltage close to the ground voltage may be induced at the floating gates FG11 and FG12 of the first and third unit cells 400A and 400C, as illustrated with reference to FIGS. 9 and 10. Thus, electrons in the floating gates FG11 and FG12 that is, 130A and 130C of FIG. 12 may be removed by an F-N tunneling mechanism due to lowered threshold voltages of the N-channel floating gate transistors 410A and 410C. As a result, the first and third unit cells 400A and 400C arrayed in the first row may be selectively erased so that the N-channel floating gate transistors 410A and 410C are in an on-state.

While the first and third unit cells 400A and 400C are erased, the ground voltage may be applied to the second to fourth array control gate lines ACG2, ACG12 and ACG22 connected to the second and fourth unit cells 400B and 400D arrayed in the second row and the ground voltage used as an erasure inhibition voltage may also be applied to the second tunneling line TUN2. Thus, erasure of the second and fourth unit cells 400B and 400D arrayed in the second row may be inhibited.

Referring again to FIG. 13, information stored in any one of the unit cells 400A~400D of the single poly NVM cell array according to an embodiment may be selectively read out by respectively applying a positive read voltage +Vread and a positive sensing voltage +Vsens to any one selected from the word lines WL1 and WL2 and any one selected from bit lines BL1 and BL2. Thus, the information stored in the selected unit cell may be read out by the same read operation as described with reference to FIG. 11.

As described above, a single poly NVM cell array according to an embodiment may execute a selective program operation of a specific unit cell as well as a selective erasure operation of a specific page by applying biases only to array control gate lines and tunneling lines. For example, the selective program operation or the selective erasure operation may be executed using only two different biases such as a positive program voltage +Vpp or a positive erasure voltage +Vee and a ground voltage. Thus, no negative charge pump circuit may be required. Accordingly, a planar area occupied by level shifters for generating bias voltages may be reduced.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A single poly nonvolatile memory (NVM) cell comprising:
   a first active region and a second active region disposed to face each other;
   a third active region and a fourth active region spaced apart from the first and second active regions;
   a drain region, a junction region and a source region disposed in the fourth active region;
   a floating gate disposed over the first and second active regions and extended onto the third and fourth active regions;
   a read/selection gate disposed to cross the fourth active region between the drain region and the junction region;
   a first array control gate line coupled to the first active region; and
   a second array control gate line coupled to the second active region.

2. The single poly NVM cell of claim 1,
   wherein the first array control gate line is coupled to the floating gate through a first capacitive element,
   wherein the first capacitive element includes the first active region and a portion of the floating gate which extends over the first active region,
   wherein the second array control gate line is coupled to the floating gate through a second capacitive element, and
   wherein the second capacitive element includes the second active region and another portion of the floating gate which extends over the second active region.

3. The single poly NVM cell of claim 1, wherein the third active region is disposed between the first active region and the second active region.

4. The single poly NVM cell of claim 3, wherein the floating gate in the first active region extends across the third active region.

5. The single poly NVM cell of claim 1, wherein the fourth active region is disposed between the first active region and the second active region.

6. The single poly NVM cell of claim 5, wherein the floating gate extends across the fourth active region.

7. The single poly NVM cell of claim 1,
   wherein the first and the second active regions are arranged in a first direction,
   wherein the fourth active region and the third active regions are arranged in a second direction, and
   wherein the second direction is different from the first direction.

8. The single poly NVM cell of claim 1, further comprising:
   a word line coupled to the read/selection gate;
   a tunneling line coupled to the third active region; and
   a bit line coupled to the drain region.

9. A single poly nonvolatile memory (NVM) cell comprising:
   a floating gate transistor having a floating gate, a source terminal, and a junction terminal;
   a read/selection transistor having a gate terminal, a drain terminal, and the junction terminal;
   a word line coupled to the gate terminal;
   a bit line coupled to the drain terminal; a first array control gate line coupled to the floating gate through a first capacitive element;
   a second array control gate line coupled to the floating gate through a second capacitive element; and
   a tunneling line coupled to the floating gate through a third capacitive element.

10. The single poly NVM cell of claim 9, wherein the first array control gate line, the second array control gate line, and the tunneling line are coupled to the floating gate in parallel.

11. A single poly nonvolatile memory (NVM) cell array comprising:
   unit cells respectively located at cross points of rows and columns;
   first array control gate lines coupled to the rows, respectively;
   word lines coupled to the rows, respectively;
   tunneling lines coupled to the rows, respectively;
   second array control gate lines coupled to the columns, respectively; and
   bit lines coupled to the columns, respectively,
   wherein each of the unit cells comprises first, second, third, and fourth active regions, wherein the first active region is coupled to one of the first array control gate lines,
   wherein the second active region is coupled to one of the second array control gate lines,
   wherein the third active region is coupled to one of the tunneling lines,
   wherein the fourth active region is coupled to one of the bit lines, and
   wherein each of the unit cells further comprises:
      a drain region, a junction region, and a source region disposed in the fourth active region;
      a floating gate extending over the first, the second, the third, and the fourth active regions; and
      a read/selection gate extending across the fourth active region and between the drain region and the junction region.

12. The single poly NVM cell array of claim 11,
   wherein the floating gate is coupled to the one of the first array control gate lines through a first capacitive element,
   wherein the first capacitive element includes the first active region and a portion of the floating gate which extends over the first active region,
   wherein the floating gate is coupled to the one of the second array control gate lines through a second capacitive element, and
   wherein the second capacitive element includes the second active region and another portion of the floating gate.

13. The single poly NVM cell array of claim 11, wherein the first active region is shared by neighboring unit cells arrayed in the same row.

14. The single poly NVM cell array of claim 11, wherein the second active region is shared by two neighboring unit cells arrayed in the same column.

15. The single poly NVM cell array of claim 11, wherein the third active region is shared by two neighboring unit cells arrayed in the same rows.

16. The single poly NVM cell array of claim 11, wherein the third active region is disposed between the first and the second active regions and has a stripe shape extending in a first direction, and
   wherein the first direction is parallel to the rows.

17. The single poly NVM cell array of claim 16, wherein the floating gate in the first active region extends across the third active region.

18. The single poly NVM cell array of claim 11, wherein the fourth active region is disposed between the first active region and the second active region.

19. The single poly NVM cell array of claim 18, wherein the floating gate in the first active region extends across the fourth active region.

20. The single poly NVM cell array of claim 11, wherein the fourth active region is disposed side by side with the third active region in a first direction, and
   wherein the first direction is parallel to the rows.

* * * * *